(12) United States Patent
Iyer et al.

(10) Patent No.: US 9,648,754 B1
(45) Date of Patent: May 9, 2017

(54) INTEGRATED CIRCUIT DEVICE SYSTEM WITH ELEVATED STACKED CONFIGURATION AND METHOD OF MANUFACTURE THEREOF

(71) Applicant: SMART Modular Technologies, Inc., Newark, CA (US)

(72) Inventors: Satyanarayan Shivkumar Iyer, Fremont, CA (US); Robert S. Pauley, Jr., Mission Viejo, CA (US); Victor Mahran, Ladera Ranch, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 154 days.

(21) Appl. No.: 14/231,622

(22) Filed: Mar. 31, 2014

Related U.S. Application Data

(63) Continuation-in-part of application No. 14/077,908, filed on Nov. 12, 2013.

(51) Int. Cl.
  *H05K 1/11* (2006.01)
  *H05K 1/14* (2006.01)
  *H05K 3/30* (2006.01)
  *H05K 1/18* (2006.01)

(52) U.S. Cl.
  CPC ............. *H05K 3/306* (2013.01); *H05K 1/181* (2013.01)

(58) Field of Classification Search
  CPC ........... G11C 5/04; H05K 1/141; H05K 1/144
  USPC ........ 174/255, 260, 261; 361/749, 760, 792, 361/803
  See application file for complete search history.

(56) References Cited

U.S. PATENT DOCUMENTS

| | | | |
|---|---|---|---|
| 6,051,878 A * | 4/2000 | Akram | H05K 1/144 257/678 |
| 6,576,992 B1 | 6/2003 | Cady et al. | |
| 6,614,664 B2 * | 9/2003 | Lee | H05K 1/144 361/748 |
| 7,023,700 B2 | 4/2006 | Chiou et al. | |
| 7,095,104 B2 | 8/2006 | Blackshear | |
| 7,358,444 B2 * | 4/2008 | Nickerson | H01L 23/5387 174/254 |
| 8,350,373 B2 | 1/2013 | Wu | |
| 8,379,391 B2 | 2/2013 | Amidi et al. | |
| 2002/0079568 A1 * | 6/2002 | Degani | H01L 23/552 257/686 |
| 2003/0111242 A1 | 6/2003 | Radu et al. | |
| 2006/0050492 A1 | 3/2006 | Goodwin et al. | |
| 2006/0067054 A1 | 3/2006 | Wang et al. | |

(Continued)

OTHER PUBLICATIONS

U.S. Appl. No. 14/077,908, Non-Final Office Action dated Sep. 2, 2015.

(Continued)

*Primary Examiner* — Yuriy Semenenko
(74) *Attorney, Agent, or Firm* — Wong & Rees LLP

(57) ABSTRACT

A system and method of manufacture of an integrated circuit device system includes: a module interposer having a module first side and a module second side; an outer chip assembly mounted to the module first side; a mirrored chip assembly mounted to the module second side, the mirrored chip assembly below the outer chip assembly; and a carrier attached to the module second side, the carrier includes a carrier first side and a carrier second side, the mirrored chip assembly suspended above the carrier first side.

20 Claims, 13 Drawing Sheets

(56) References Cited

U.S. PATENT DOCUMENTS

| | | | |
|---|---|---|---|
| 2008/0036061 A1 | 2/2008 | Chainer | |
| 2009/0032926 A1 | 2/2009 | Sharifi | |
| 2009/0185045 A1 | 7/2009 | Rosenblatt et al. | |
| 2009/0279243 A1* | 11/2009 | Amidi | G11C 5/04 361/679.31 |
| 2010/0079966 A1 | 4/2010 | Baek | |
| 2013/0027875 A1* | 1/2013 | Zhu | G06F 1/185 361/679.58 |
| 2013/0083473 A1* | 4/2013 | Mahran | H05K 7/1431 361/679.32 |

OTHER PUBLICATIONS

U.S. Appl. No. 14/077,908, Non-Final Office Action dated Nov. 10, 2015.

U.S. Appl. No. 14/077,908, Final Office Action dated Mar. 25, 2016.

\* cited by examiner

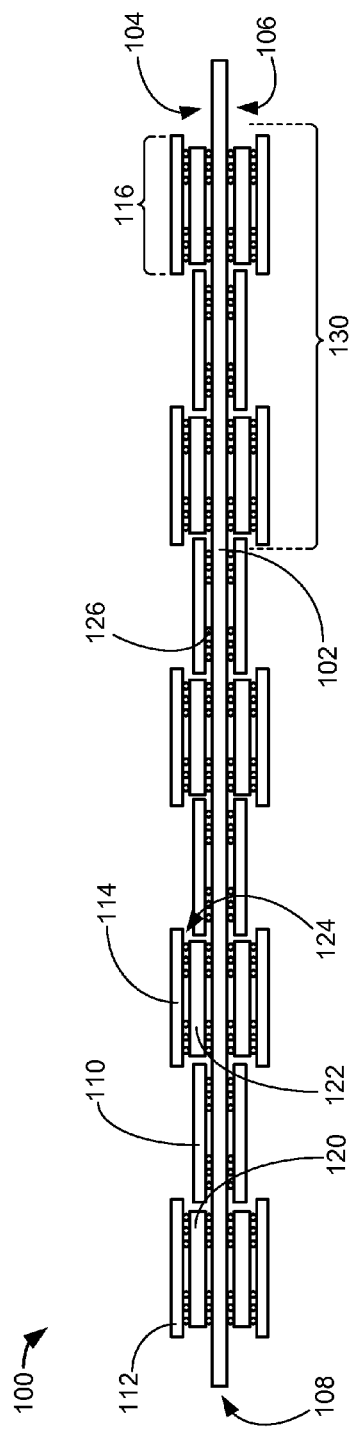
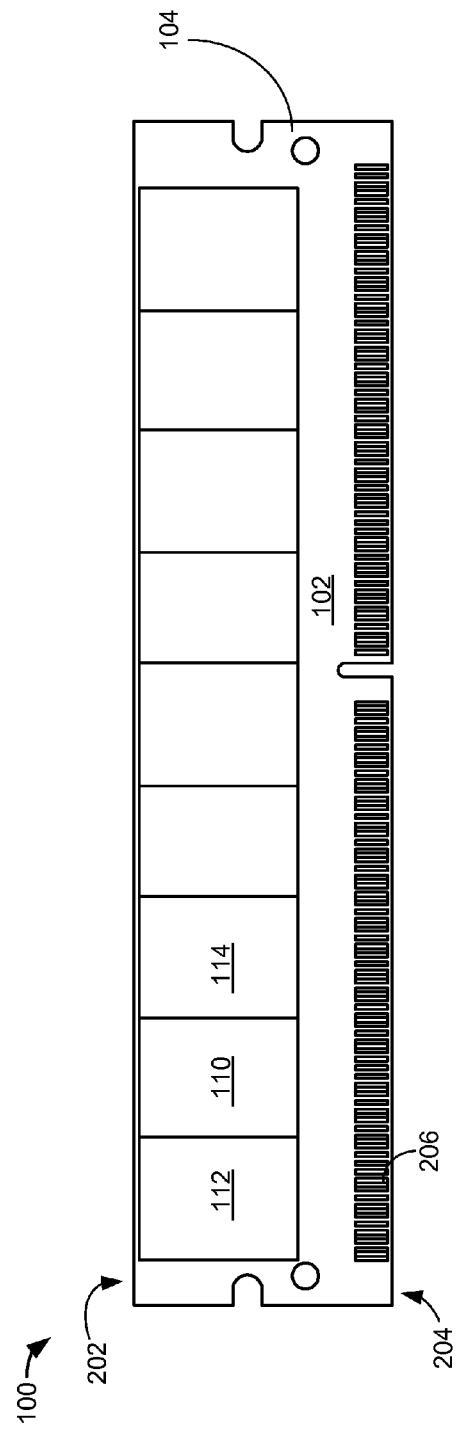
FIG. 1
FIG. 2

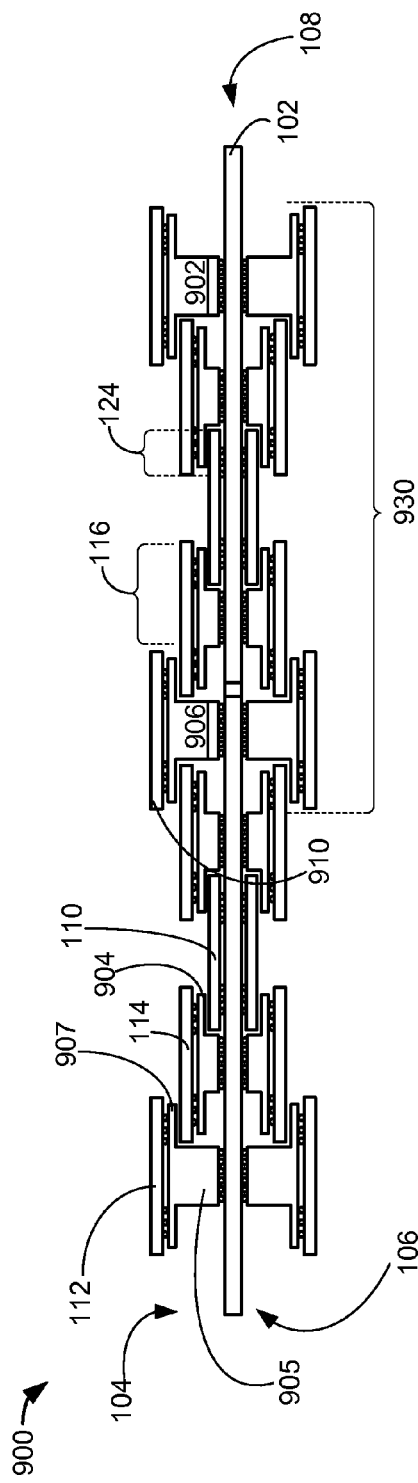
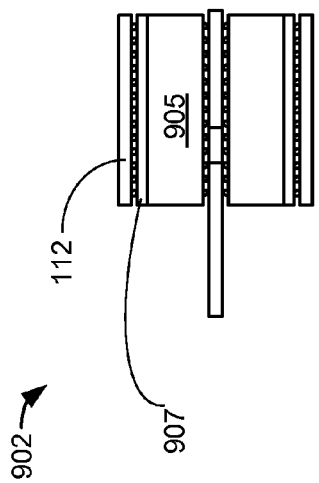
FIG. 9
FIG. 10

INTEGRATED CIRCUIT DEVICE SYSTEM WITH ELEVATED STACKED CONFIGURATION AND METHOD OF MANUFACTURE THEREOF

CROSS-REFERENCE TO RELATED APPLICATION(S)

This is a continuation-in-part of co-pending U.S. patent application Ser. No. 14/077,908 filed Nov. 12, 2013.

TECHNICAL FIELD

The present invention relates generally to an integrated circuit device system, and more particularly to a system with an elevated stacked configuration.

BACKGROUND ART

There is a continual need in the area of electronics and electronic computing systems toward smaller systems and/or systems with greater computing performance for a given space. Within these systems, the integrated circuit and memory modules are the building block used in a high performance electronic system to provide applications for usage in products such as automotive vehicles, computers, cell phone, intelligent portable military devices, aeronautical spacecraft payloads, and a vast line of other similar products that require small compact electronics supporting many complex functions.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry, memory capacity, and the amount of electrical connections inside a product are key to improving the features, performance, and reliability of any product. Furthermore, the ways the circuitry and electrical connections are implemented can determine the device size, packaging methods, and the individual packaging designs. Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system for improved performance, yield, thermal cooling, low profile, and improved reliability. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit device system, including: providing a module interposer having a module first side and a module second side; mounting an outer chip assembly to the module first side; mounting a mirrored chip assembly to the module second side, the mirrored chip assembly below the outer chip assembly; and attaching a carrier on the module second side, the carrier includes a carrier first side and a carrier second side, the mirrored chip assembly suspended above the carrier first side.

The present invention provides an integrated circuit device system including: a module interposer having a module first side and a module second side; an outer chip assembly mounted to the module first side; a mirrored chip assembly mounted to the module second side, the mirrored chip assembly below the outer chip assembly; and a carrier attached to the module second side, the carrier includes a carrier first side and a carrier second side, the mirrored chip assembly suspended above the carrier first side.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 1 is a top view of an integrated circuit device system in a first embodiment of the present invention.

FIG. 2 is a side view of the integrated circuit device system of FIG. 1.

FIG. 9 is top view of an integrated circuit device system in a third embodiment of the present invention.

FIG. 10 is a peripheral end view of the first riser of FIG. 9.

BEST MODE FOR CARRYING OUT THE INVENTION

Figure 3:
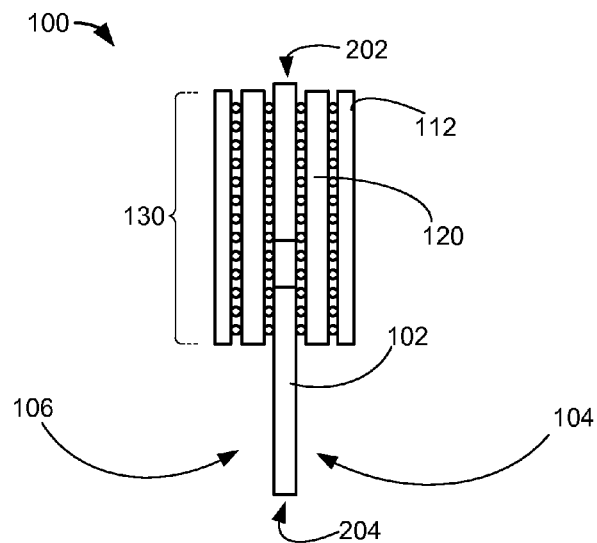
FIG. 3 is a peripheral end view of the integrated circuit device system of FIG. 1.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

The term "active side" refers to a side of a die, a module, a package, or an electronic structure having active circuitry fabricated thereon or having elements for connection to the active circuitry within the die, the module, the package, or the electronic structure.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means there is direct physical contact between elements. The term "directly on" means there is direct physical contact between elements with no intervening elements. The term "overhang" as used herein includes an object suspended over another object with a portion of both objects directly facing each other. The first object suspended over the second object do not touch or are not in direct contact with each other.

Referring now to FIG. 1, therein is shown a top view of an integrated circuit device system 100 in a first embodiment of the present invention. The top view can depict a view of the integrated circuit device system 100 that is inserted into another system or device (both not shown). The integrated circuit device system 100 can include a carrier 102, integrated circuit devices, a first riser 120, and a second riser 122.

The carrier 102 provides structural support for components and semiconductor devices mounted thereon. For example, the carrier 102 can be a printed circuit board (PCB) for mounting memory device such as dynamic random access memory (DRAM) module units.

Further for example, the carrier can be a substrate including semi-conductive material, a core of conductive material, metal, or alloy such as copper as an example. The carrier 102 can include a first side 104 and a second side 106 opposite to the first side 104. The carrier 102 can also include a peripheral end 108, which is end side of the carrier 102 perpendicular to the first side 104 and the second side 106.

The integrated circuit device system 100 can include a number of integrated circuit devices including a base device 110, a peripheral stacked device 112, and an inner stacked device 114. The base device 110, the peripheral stacked device 112, and the inner stacked device 114 can be integrated circuit devices, chips, or semiconductor devices.

The base device 110 is defined as a semiconductor device having one or more integrated transistors for implementing active circuitry. For example, the base device 110 can include interconnects, passive devices, or a combination thereof. The base device 110 is directly attached to the first side 104 of the carrier 102. The base device 110 is preferably shown in a flip-chip configuration.

The peripheral stacked device 112 is defined as a semiconductor device having one or more integrated transistors for implementing active circuitry. For example, the peripheral stacked device 112 can include interconnects, passive devices, or a combination thereof. The peripheral stacked device 112 is arranged at the periphery of the carrier 102 directly adjacent to the peripheral end 108, with no intervening components between the periphery end 108 and the peripheral stacked device 112.

The peripheral stacked device 112 is mounted or stacked above the base device 110 having a top surface of the peripheral stacked device 112 above a top surface of the base device 110. The peripheral stacked device 112 is preferably shown in a flip-chip configuration.

The inner stacked device 114 is defined as a semiconductor device having one or more integrated transistors for implementing active circuitry. For example, the inner stacked device 114 can include interconnects, passive devices, or a combination thereof. The inner stacked device 114 is arranged away from the periphery of the carrier 102 with the base device 110 between the inner stacked device 114 and the peripheral stacked device 112.

The inner stacked device 114 is mounted or stacked above the base device 110 having a top surface of the inner stacked device 114 above a top surface of the base device 110. The inner stacked device 114 is preferably shown in a flip-chip configuration.

The base device 110, the peripheral stacked device 112, and the inner stacked device 114 can be interchangeable and only differ by the arrangement of the devices on the carrier 102. For example, the base device 110, the peripheral stacked device 112, and the inner stacked device 114 can be uniform or standardized chips having identical dimensions.

Further for example, the peripheral stacked device 112, the base device 110, and the inner stacked device 114 can have identical sides, components, and functions. For example, the top and bottom sides of the inner stacked device 114 can be coplanar to the top and bottom sides of the peripheral stacked device 112. The peripheral stacked device 112, the base device 110, and the inner stacked device 114 can be DRAM units with the dimensions of 8.5 millimeters (mm)×11 mm×1.10 mm.

The base device 110, the peripheral stacked device 112, and the inner stacked device 114 can include a length 116 for measuring a lateral side of the base device 110, the peripheral stacked device 112, and the inner stacked device 114. The length 116 is defined as a measurement of a side taken from the direction of the peripheral end 108 to another of the peripheral end 108 at the opposite side of the carrier 102.

The integrated circuit device system 100 can include a first riser 120 and a second riser 122, which are defined as structures for elevating the peripheral stacked device 112 and the inner stacked device above the base device 110. The first riser 120 and the second riser 122 can preferably be interposers, although the first riser 120 and the second riser 122 can include other chips or structures that can redistribute an electrical connection. The first riser 120 and the second riser 122 can be mounted to the first side 104 of the carrier 102.

The first riser 120 can be immediately adjacent to the peripheral end 108. The peripheral stacked device 112 can be mounted directly on the first riser 120 for elevating the peripheral stacked device 112 above the base device 110. The inner stacked device 114 can be mounted directly on the second riser 122 for elevating the inner stacked device 114 above the base device 110. The base device 110 can be mounted between the first riser 120 and the second riser 122 on the first side 104.

The first riser 120 can be identical to the second riser 122. The first riser 120 and the second riser 122 can include vias for providing a vertical or "z-type" electrical connection between components and the carrier 102. The first riser 120 and the second riser 122 can include the dimensions of 7.25 mm×11 mm×1.27 mm.

The first riser 120 allows the peripheral stacked device 112 to have a chip overhang 124. The chip overhang 124 is an overlapping of a stacked device over components, such as the base device 110 or the carrier 102. The chip overhang 124 includes overlapping without the stacked device touching or being in direct contact with a component below the stacked device. For example, the second riser 122 allows the inner stacked device 114 to have the chip overhang 124 above the base device 110. A portion of the peripheral stacked device 112 and a portion of the inner stacked device 114 can be suspended over and directly facing a top surface of the base device 110.

The chip overhang 124 can include a measurable amount for the overlap or overhang. For example, the chip overhang 124 can include a value such as 0.63 mm to 0.14 mm for the length 116 of the chip overhang 124. The chip overhang 124 can also include a measurement such as a ratio of a dimension of the stacked chip. For example, the chip overhang 124 can include fifty percent to zero percent of the length 116 of the peripheral stacked device 112, which overhangs the base device 110 or the carrier 102.

Further for example, the lateral overlap can be anywhere from zero to half the length 116 of the peripheral stacked device 112 or the inner stacked device 114. The chip overhang 124 can be more than half the length 116 of the peripheral stacked device 112 or the inner stacked device 114, provided that the peripheral stacked device 112 and the inner stacked device 114 are not in direct contact with each other.

The integrated circuit device system 100 can include a device interconnect 126 for connecting components to other components or the carrier 102. The device interconnect 126 provides an electrical connection and can include a solder ball, solder bump, or a solder pillar as examples. The device interconnect 126 can attach the first riser 120, the second riser 122, and the base device 110 to the carrier 102. The device interconnect 126 can attach the peripheral stacked device 112 and the inner stacked device 114 to the first riser 120 and the second riser 122.

The integrated circuit device system 100 can include a mirrored chip assembly 130 attached to the second side 106 of the carrier 102. The mirrored chip assembly 130 can include an identical copy of the base device 110, the peripheral stacked device 112, the inner stacked device 114, the first riser 120, and the second riser 122, where the identical components are attached to the second side 106. For example, the second side 106 can include an identical copy of the first riser 120, which is positioned or mounted on the same location but on the opposite side of the carrier 102. The mirrored chip assembly 130 will be described in further detail below.

It has been discovered that the configuration and spacing of the base device 110, the peripheral stacked device 112, the inner stacked device 114, the first riser 120, and the second riser 122 provides additional space on the carrier 102 for increasing the capacity of the carrier 102 to hold more devices.

It has been found that the stacked arrangement of chips on the first riser 120 and the second riser 122 provide for the peripheral stacked device 112 and the inner stacked device 114 to be stacked above the base device 110 for increasing the capacity of devices on the carrier 102. For example, the chip overhang 124, where the peripheral stacked device 112 and the inner stacked device 114 are suspended over the base device 110 and the carrier 102 increases the mountable area for mounting memory modules.

It has been found that the stacked configuration and arrangement of the integrated circuit device system 100 can be used with standardized and uniform devices or customized devices with different sizes and dimensions. For example, the stacking arrangement and the chip overhang 124, from the first riser 120 and the second riser 122, provide a system that allows uniform sized chips and chips with different dimensions to be mounted on the carrier 102.

Further, it has been found that the chip overhang 124 allows for devices of different sizes to be arranged on the carrier 102. For example, the base device 110 can have a different value for the length 116 than the peripheral stacked device 112 and the inner stacked device 114. Further for example, the chip overhang 124 allows the peripheral stacked device 112 and the inner stacked device 114 to have different lengths or different overlaps with the base device 110. The variations between the lengths of the peripheral stacked device 112 and the inner stacked device 114 are limited by the mounting space on the carrier 102 and the space required to keep chips from contacting each other.

It has been found that the overlapping configuration of the integrated circuit device system 100 provides cooling and air flow in combination with the increased amount of chips mounted in the same mounting area. Further, it has been found that the heights, spaces, and distances between the base device 110, the peripheral stacked device 112, the inner stacked device 114, the first riser 120, and the second riser 122 provides for air cooling and for buffering space to prevent physical damage between components from temporary warpage and component shifting.

Further, it has been found that the mirrored chip assembly 130 further increases the capacity of devices that can be mounted on the carrier 102. The base device 110, the peripheral stacked device 112, the inner stacked device 114, the first riser 120, and the second riser 122 can have an identical copy in the mirrored chip assembly 130 mounted to the second side 106.

It has been also found that the mirrored chip assembly 130 allows for an identical manufacturing process for the second side 106 as for the first side 104, which simplifies manufacturing steps and increases production yield.

Referring now to FIG. 2, therein is shown a side view of the integrated circuit device system 100 of FIG. 1. The side view shows the first side 104 of the carrier 102 including the peripheral stacked device 112, the base device 110, and the inner stacked device 114.

The carrier 102 can include an extraction end 202 and an insertion end 204 opposite to the extraction end 202. The extraction end 202 can be used to physically remove the integrated circuit device system 100 from other systems, devices, sockets, boards, or a combination thereof. The insertion end 204 can include a carrier interconnect 206 for connecting the carrier 102 to other systems, devices, sockets, boards, or a combination thereof.

The carrier interconnect 206 provides an electrical connection between the carrier 102 and external systems (not shown). The carrier interconnect 206 can include contacts, pads, or leads. The carrier interconnect 206 can be exposed from the first side 104 of the carrier 102 at the insertion end 204 of the carrier 102.

Referring now to FIG. 3, therein is shown a peripheral end view of the integrated circuit device system 100 of FIG. 1. The peripheral end view can depict the first side 104 and the second side 106 of the carrier 102. The peripheral end view can include the insertion end 204, the extraction end 202, the peripheral stacked device 112, the first riser 120, and a portion of the mirrored chip assembly 130.

The peripheral stacked device 112 is coplanar to the first riser 120 and the mirrored chip assembly 130 at the extraction end 202. A portion of the carrier 102 at the extraction end 202 is shown protruding beyond the peripheral stacked device 112, the first riser 120, and a portion of the mirrored chip assembly 130.

It has been found that the protrusion of the carrier 102 at the extraction end 202 provides structural support and protection from physical damage for the peripheral stacked device 112, the first riser 120, and a portion of the mirrored chip assembly 130 at the extraction end 202.

Figure 4:
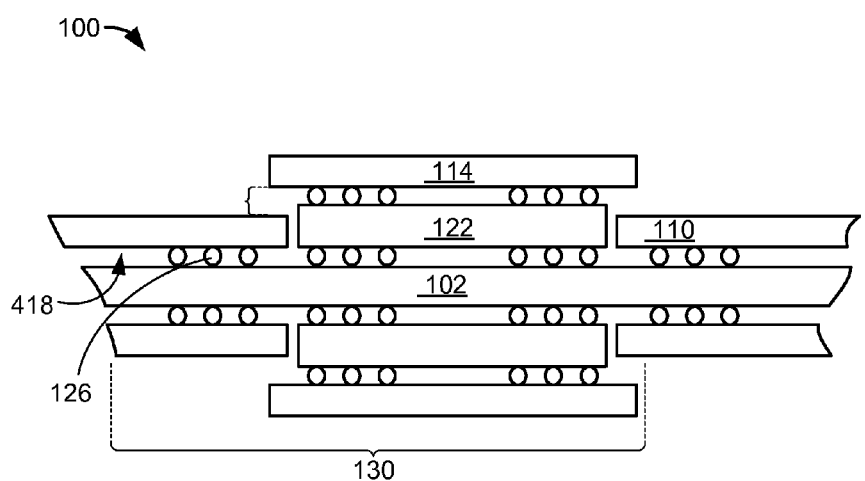
FIG. 4 is a detailed view of the integrated circuit device system of FIG. 1.

Referring now to FIG. 4, therein is shown a detailed view of the integrated circuit device system 100 of FIG. 1. For illustrative purposes, the detailed view can depict example dimensions and measurements for the integrated circuit device system 100 in a low profile and high chip density configuration.

The detailed view can include the carrier 102, the base device 110, the inner stacked device 114, the second riser 122, and a portion of the mirrored chip assembly 130. The detailed view can illustrate the gaps and spaces between the base device 110, the inner stacked device 114, the second riser 122, and the device interconnect 126.

The component dimensions, gaps, and spaces of the mirrored chip assembly 130 can be identical to the component dimensions, gaps, and spaces of the base device 110, the inner stacked device 114, and the second riser 122. The base device 110 can include an interconnect side 418, which is the active side for interconnection of the chip.

For example, the device interconnect 126 can have a height of 0.30 millimeters (mm) measured from the first side 104 of FIG. 1 to the interconnect side 418 of the base device 110 or the second riser 122. The vertical height of 0.30 mm provides sufficient space for air flow but also maintains a low profile for the integrated circuit device system 100. The height of the inner stacked device 114, measured from the first side 104 to the top surface of the inner stacked device 114, can be 2.50 mm.

Further for example, the height of the second riser 122 can be 1.10 mm measured from the bottom surface of the second riser 122 to the top surface of the second riser 122. The length 116 of FIG. 1 of the second riser 122 can be 7.15 mm. The pitch distance between the device interconnect 126 and another of the device interconnect 126 can be 0.80 mm. The dimensions of the second riser 122 can be identical to the dimensions of the first riser 120 of FIG. 1.

The gap or space between the top surface of the base device 110 and the bottom surface of the inner stacked device 114 can include a height of 0.60 mm. The spaces and gaps between components of the integrated circuit device system 100 allow for temporally warpage of the carrier 102 without damaging adjacent components. For example, the inner stacked device 114 with a gap or separation of 0.60 mm from the top surface of the base device 110 provides slack and provides buffer space for preventing damage from physical contact.

It has been found that the overlapping configuration of the integrated circuit device system 100 provides cooling and air flow in combination with an increased amount of chips mounted in the same area. Further, it has been found that the heights and distances between the base device 110, the peripheral stacked device 112, the inner stacked device 114, the first riser 120, and the second riser 122 provides for a buffer space to prevent physical damage from temporary warpage and component shifting.

It has been found that the total assembly height of 2.50 mm, the length 116 of the second riser 122, and the stacked and overlapping configuration of the integrated circuit device system 100 provides for a low profile and high chip density configuration in a memory device. For example, the heights and dimensions of the components of the integrated circuit device system 100, such as the height of the inner stacked device 114 and the length 116 of the second riser 122, increases the amount of memory devices that can be mounted to the carrier 102 but also maintains a low device profile.

Figure 5:
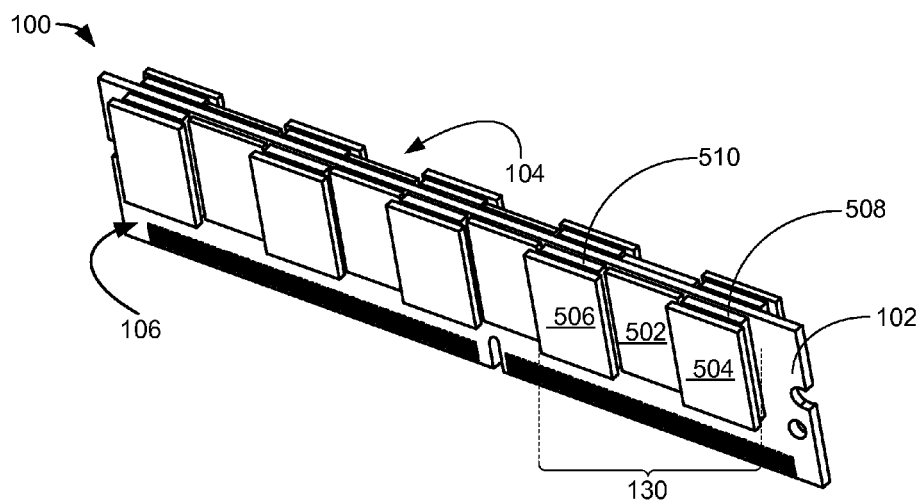
FIG. 5 is an isometric view of the integrated circuit device system of FIG. 1.

Referring now to FIG. 5, therein is shown an isometric view of the integrated circuit device system 100 of FIG. 1. The isometric view can depict the components of the mirrored chip assembly 130. The mirrored chip assembly 130 can be attached to the second side 106 of the carrier 102 and include a mirrored base device 502, a mirrored peripheral device 504, a mirror inner device 506, a mirrored first riser 508, and a mirrored second riser 510.

The mirrored base device 502 can be identical to the base device 110 of FIG. 1 except that the mirrored base device 502 is mounted to the second side 106. The mirrored peripheral device 504 can be identical to the peripheral stacked device 112 of FIG. 1 except that the mirrored peripheral device 504 is connected to the second side 106.

The mirrored inner device 506 can be identical to the inner stacked device 114 of FIG. 1 except that the mirrored inner device 506 is connected to the second side 106. The mirrored first riser 508 can be identical to the first riser 120 of FIG. 1 except that the mirrored first riser 508 is mounted to the second side 106. The mirrored second riser 510 can be identical to the second riser 122 of FIG. 1 except that the mirrored second riser 510 is mounted to the second side 106.

It has been found that the mirrored chip assembly 130 provides a higher density module without the use of additional packaging materials or conventional dual-die-packages (DDP). Thus, it has been found that the mirrored chip assembly 130 attached to the second side 106 with the base device 110, the peripheral stacked device 112, and the inner stacked device 114 attached to the first side 104 increases device capacity while decreasing the number of ranks required.

It has also been found that the mirrored chip assembly 130 further increases the capacity of devices that can be mounted on the carrier 102. The base device 110, the peripheral stacked device 112, the inner stacked device 114, the first riser 120, and the second riser 122 can have an identical copy in the mirrored chip assembly 130 mounted to the second side 106. Further it has been found that the mirrored chip assembly 130 allows for an identical manufacturing process for the second side 106 as for the first side 104, which simplifies manufacturing steps and increases production yield.

Figure 6:
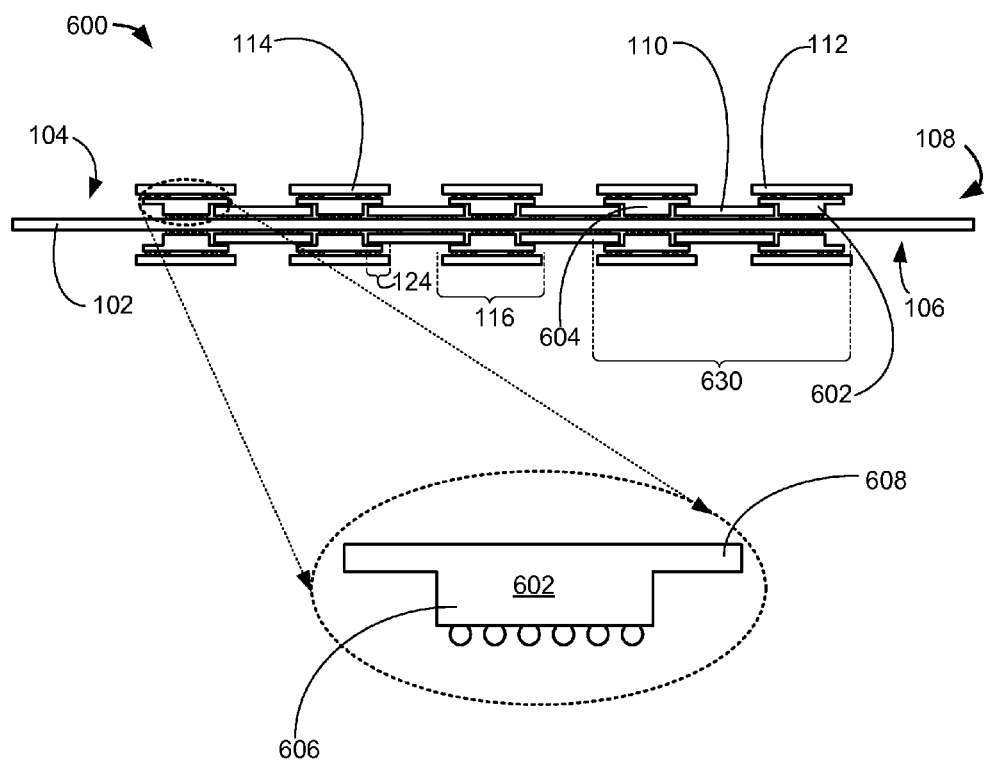
FIG. 6 is a top view of an integrated circuit device system in a second embodiment of the present invention.

Referring now to FIG. 6, therein is shown a top view of an integrated circuit device system 600 in a second embodiment of the present invention. The integrated circuit device system 600 and be identical to the integrated circuit device system 100 of FIG. 1 except that the integrated circuit device system 600 can include a first riser 602 and a second riser 604, both with a "T-shaped" configuration.

It is understood that the integrated circuit device system 600 can include identical elements and components as the integrated circuit device system 100. For example, the integrated circuit device system 600 can include the base device 110, the peripheral stacked device 112, the inner stacked device 114, and the device interconnect 126 of FIG. 1.

The first riser 602 can include a body portion 606 and a protrusion portion 608. The body portion 606 of the first riser 602 provides a base for components and devices mounted thereon. The body portion 606 is mounted directly to the carrier 102. The first riser 602 can be identical to the second riser 604.

The protrusion portion 608 of the first riser 602 extends from the body portion 606. The protrusion portion 608 can protrude towards the peripheral end 108 of the carrier and towards another of the peripheral end 108 at the opposite end of the carrier 102. The protrusion portion 608 and the top surface of the first riser 602 can provide additional mounting space for components to be mounted above the carrier 102 and the base device 110.

The protrusion portion 608 can overhang the base device 110, allowing for the body portion 606 to be narrower for increasing mounting space for components mounted directly to the carrier 102. For example, the base device 110 and another of the base device 110 can be mounted closer together because the space required from the body portion 606 is reduced.

The protrusion portion 608 can overhang the base device 110. For example, the protrusion portion 608 can overlap the base device 110 including the length 116 of 0.14 mm to 0.20 mm. The peripheral stacked device 112 and the inner stacked device 114 can include the chip overhang 124, which overlaps the base device 110 and the carrier 102.

The first riser 602 and the second riser 604 can also include a redistribution layer and vias for interconnection between the carrier 102, the peripheral stacked device 112, and the inner stacked device 114. The length 116 between an outer edge of the peripheral stacked device 112 and another of the peripheral stacked device 112 at the opposite end of the carrier 102 can be 61.15 mm.

The integrated circuit packaging system 600 includes a mirrored chip assembly 630. The mirrored chip assembly 630 can be identical to the mirrored chip assembly 130 of FIG. 1 except that the mirrored chip assembly 630 includes the first riser 602 and the second riser 604.

It has been discovered that the body portion 606 and the protrusion portion 608 of the first riser 602 and the second riser 604 further increases the capacity of the carrier 102 to hold more devices. It has been found that the narrow dimensions of the body portion 606 provide for more chips or longer chips to be mounted to the carrier 102. It has been found that the protrusion portion 608 provides for devices of multiple sizes to be mounted above the base device 110 because of the protrusion portion 608 extends the mounting area beyond the length 116 of the body portion 606.

It has been discovered that the configuration and spacing of the base device 110, the peripheral stacked device 112, the inner stacked device 114, the first riser 602, and the second riser 604 provides additional space on the carrier 102 for increasing the capacity of the carrier 102 to hold more devices.

It has been found that the stacked arrangement of chips on the first riser 602 and the second riser 604 provide for the peripheral stacked device 112 and the inner stacked device 114 to be stacked above the base device 110 for increasing the capacity of devices on the carrier 102. For example, the chip overhang 124, where the peripheral stacked device 112 and the inner stacked device 114 are suspended over the base device 110 and the carrier 102, increases the mountable area for mounting memory modules.

It has been found that the stacked configuration and arrangement of the integrated circuit device system 600 can be used with standardized and uniform devices or customized devices with different sizes and dimensions. For example, the stacking arrangement and the chip overhang 124 provided by the first riser 602 and the second riser 604 provide a system that allows uniform sized chips and chips with different dimensions to be mounted on the carrier 102.

Further, it has been found that the chip overhang 124 allows for devices of different sizes to be arranged on the carrier 102. For example, the base device 110 can have a different value for the length 116 than the peripheral stacked device 112 and the inner stacked device 114. Further for example, the chip overhang 124 allows the peripheral stacked device 112 and the inner stacked device 114 to have different lengths or different overlaps with the base device 110. The variations between the lengths of the peripheral stacked device 112 and the inner stacked device 114 are limited by the mounting space on the carrier 102 and the space required to keep chips from contacting each other.

It has been found that the overlapping configuration of the integrated circuit device system 600 provides cooling and air flow in combination with the increased amount of chips mounted in the same mounting area. Further, it has been found that the heights, spaces, and distances between the base device 110, the peripheral stacked device 112, the inner stacked device 114, the first riser 602, and the second riser 604 provides for air cooling and provides for a buffer space to prevent physical damage between components from temporary warpage and component shifting.

Further, it has been found that the mirrored chip assembly 630 further increases the capacity of devices that can be mounted on the carrier 102. The base device 110, the peripheral stacked device 112, the inner stacked device 114, the first riser 602, and the second riser 604 can have an identical copy in the mirrored chip assembly 630 mounted to the second side 106.

It has been also found that the mirrored chip assembly 630 allows for an identical manufacturing process for the second side 106 as for the first side 104, which simplifies manufacturing steps and increases production yield.

Figure 7:
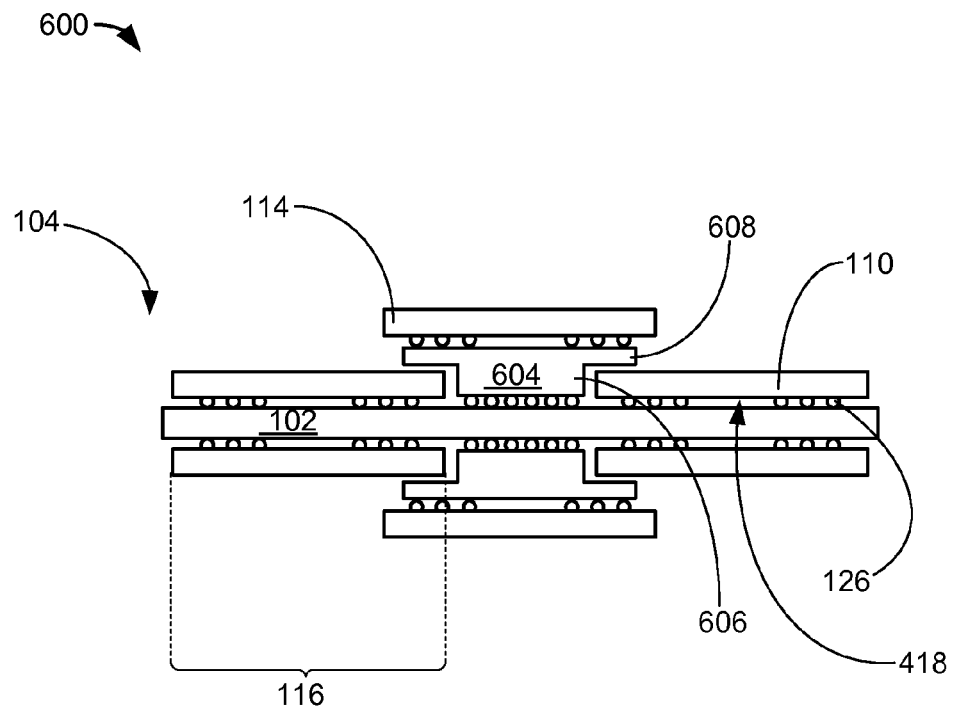
FIG. 7 is a detailed view of the integrated circuit device system of FIG. 6.

Referring now to FIG. 7, therein is shown a detailed view of the integrated circuit device system 600 of FIG. 6. For illustrative purposes, the detailed view can depict example dimensions and measurements for the integrated circuit device system 600 in a low profile and high chip density configuration.

For example, the device interconnect 126 can have a height of 0.30 mm measured from the first side 104 to the interconnect side 418 of the base device 110 or the second riser 604. The height of 0.30 mm provides sufficient space for air flow and cooling but also maintains a low profile for the integrated circuit device system 600.

Further for example, the height of the second riser 604 can be 1.10 mm from the bottom surface of the second riser 604 to the top surface of the second riser 604. The top surface of the second riser 604, including the length 116 of an outer edge of the protrusion portion 608 to another outer edge of the protrusion portion 608 can be 7.15 mm.

The height of the protrusion portion 608 can include a length 116 of 0.60 mm. The length 116 of the body portion 606 can include a length of 4.00 mm, which is measured in the direction of the base device 110 to another of the base device 110. The dimensions of the second riser 604 can be identical to the dimensions of the first riser 120 of FIG. 1 and the second riser 122 of FIG. 1.

Further for example, the gap or space between the top surface of the base device 110 and the bottom surface of the inner stacked device 114 can include a height of 0.60 mm. The spaces and gaps between components of the integrated circuit device system 600 allow temporally warpage and shifting without damaging adjacent components. For example, the inner stacked device 114 with a gap or separation of 0.60 mm from the top surface of the base device 110 provides slack and a buffer space for preventing damage from physical contact.

It has been found that the overlapping configuration of the integrated circuit device system 600 provides cooling and air flow in combination with an increased capacity for mounting chips on the carrier 102. Further, it has been found that the heights, spaces, and distances between the base device 110, the peripheral stacked device 112, the inner stacked device 114, the first riser 602, and the second riser 604 allows for cooling and provides for a buffer space to prevent physical damage from temporary warpage and shifting.

Figure 8:
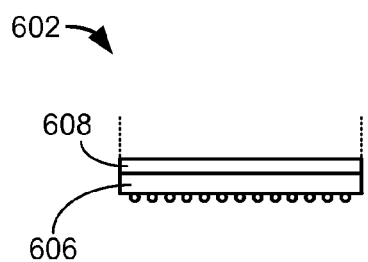
FIG. 8 is a peripheral end view of the first riser of FIG. 6.

Referring now to FIG. 8, therein is shown a peripheral end view of the first riser 602 of FIG. 6. The peripheral end view is taken from the peripheral end 108 of FIG. 6 of the carrier 102 of FIG. 2. The peripheral end view can include the body portion 606 and the protrusion portion 608.

The protrusion portion 608 extends beyond the body portion 606 from the peripheral end 108 and a side opposite to the peripheral end 108 (not shown). The top surface of the first riser 602 can include a width of 11.00 mm, measured from the extraction end 202 of FIG. 2 of the carrier 102 to the insertion end 204 of FIG. 2 of the carrier 102.

The vertical height of the first riser 602 can be from 1.10 mm to 1.60 mm, measured from the bottom surface of the body portion 606 to the top surface of the protrusion portion 608. Further for example, the height of the base portion can be 1.00 mm and the vertical height of the protrusion portion can be 0.60 mm.

It has been found that the overlapping configuration of the integrated circuit device system 600, from the first riser 602, provides cooling, buffer space between components, and air flow in combination with an increased capacity for mounting chips on the carrier 102.

Referring now to FIG. 9, therein is shown top view of an integrated circuit device system 900 in a third embodiment of the present invention. The integrated circuit device system 900 and be identical to the integrated circuit device system 600 of FIG. 6 except that the integrated circuit device system 900 can include a first riser 902, a second riser 904, and a third riser 906. The first riser 902, the second riser 904, and the third riser 906 can each include a "T-shaped" configuration.

It is understood that the integrated circuit device system 900 can include identical elements and components as the integrated circuit device system 100 of FIG. 1 and the integrated circuit device system 600 of FIG. 6. For example, the integrated circuit device system 900 can include the base device 110, the peripheral stacked device 112, the inner stacked device 114, and the device interconnect 126 of FIG. 6.

The second riser 904 can be identical to the second riser 604 of FIG. 6. For example, the second riser 904 can include the body portion 606 of FIG. 6 and the protrusion portion 608 of FIG. 6. The inner stacked device 114 of FIG. 6 can be directly attached to the top surface of the second riser 904. The second riser 904 can be between the first riser 902 and the base device 110 on the carrier 102.

The first riser 902 can be mounted immediately adjacent to the peripheral end 108 of the carrier 102, with no intervening elements between the first riser 902 and the peripheral end 108. The first riser 902 can be structurally similar to the second riser 904 except that the first riser 902 includes a vertical height that extends above the inner stacked device 114 and the second riser 904.

The vertical height can be measured as a distance away from the surface of the carrier 102, using the carrier 102 as a starting point. For example, the first riser 902 can have a vertical height of 3.00 mm to 6.00 mm, depending on the configuration of the integrated circuit device system 900. The peripheral stacked device 112, mounted to the first riser 902, can include the length 116 of 11.00 mm as an example.

The first riser 902 can include a body portion 905 and a protrusion portion 907. The body portion 905 of the first riser 902 provides a base for components and devices mounted thereon. The body portion 905 is mounted directly to the carrier 102. The first riser 902 can include the length 116 of 10.00 mm as an example.

The protrusion portion 907 of the first riser 902 extends from the body portion 905. The protrusion portion 907 can protrude towards the peripheral end 108 of the carrier 102 and towards another of the peripheral end 108 at the opposite end of the carrier 102. The protrusion portion 907 and the top surface of the first riser 902 can provide additional mounting space for components to be mounted above the carrier 102, the base device 110, and the inner stacked device 114.

The protrusion portion 907 can overhang the inner stacked device 114 that is mounted to the second riser 904. The peripheral stacked device 112 can be directly mounted to the first riser 902. The chip overhang 124 for the protrusion portion 907 can be between 0.14 mm to 2.00 mm, as examples.

The third riser 906, such as a center riser, can be identical to the first riser 902 except that the third riser 906 is mounted to a central position on the first side 104. For example, the third riser 906 can be mounted in a position on the first side 104 that is an equal distance from the peripheral end 108 and another of the peripheral end 108 at the opposite end of the carrier 102.

The integrated circuit packaging system 900 can include a central stacked device 910. The central stacked device 910 can be identical to the peripheral stacked device 112 except that the central stacked device 910 is directly mounted to the third riser 906.

The first riser 902, the second riser 904, and the third riser 906 provide for three horizontal levels for mounting devices on the carrier 102. For example, the first riser 902 provides for the peripheral stacked device 112 to be mounted above the inner stacked device 114. The second riser 904 provides for the inner stacked device 114 to be mounted over the base device 110 and below the peripheral stacked device 112. The third riser 906 provides for the central stacked device 910 to be mounted over the inner stacked device 114 at a midpoint of the first side 104.

The first riser 902, the second riser 904, and the third riser 906 can also include a redistribution layer and vias for interconnection between the carrier 102 and other stacked devices. The integrated circuit device system 900 can include a mirrored chip assembly 930 mounted to the second side 106 of the carrier 102.

The mirrored chip assembly 930 is similar to the mirrored chip assembly 130 of FIG. 1 and the mirrored chip assembly 630 of FIG. 6. The mirrored chip assembly 930 can include identical components that are mounted to the first side 104, having the same position and configuration on the second side 106. For example, the mirrored chip assembly 930 can include an identical set of the third riser 906, the central stacked device 910, the first riser 902, the second riser 904, the peripheral stacked device 112, the inner stacked device 114, and the base device 110.

It has been discovered that the first riser 902, the second riser 904, and the third riser 906 provide three different horizontal levels of additional mounting space for components on the carrier 102. It has been found that the first riser 902 provides additional space for larger devices to be mounted over smaller devices. For example, the peripheral stacked device 112, mounted to the first riser 902 and overhanging the inner stacked device 114, can be equal to, smaller, or larger in dimensions than the inner stacked device 114 because of the overhanging position.

It has been discovered that the body portion 905 and the protrusion portion 907 of the first riser 902 further increases the capacity of the carrier 102 to hold more devices. It has been found that the narrow dimensions or narrow length of the body portion 905 provide for more chips or longer chips to be mounted to the carrier 102. If has been also found that the vertical height of the body portion 905, which extends above the inner stacked device 114, provides an additional horizontal level for mounting components.

It has been found that the protrusion portion 907 provides for devices of multiple sizes to be mounted above the base device 110 and the carrier 102 because of the protrusion portion 907 extends the mounting area beyond the length 116 of the body portion 905. It has been discovered that the configuration and spacing of the base device 110, the peripheral stacked device 112, the inner stacked device 114, the first riser 902, and the second riser 904 provides additional space on the carrier 102 for increasing the capacity of the carrier 102 to hold more devices.

It has been found that the stacked arrangement of chips on the first riser 902, the second riser 904, and the third riser 906 provide for the peripheral stacked device 112 and the inner stacked device 114 to be stacked above the base device 110 for increasing the capacity of devices on the carrier 102. For example, the chip overhang 124, where the peripheral stacked device 112 and the inner stacked device 114 are suspended over the base device 110 and the carrier 102, increases the mountable area for mounting memory modules.

It has been found that the stacked configuration and arrangement of the integrated circuit device system 900 can be used with standardized and uniform devices or customized devices with different sizes and dimensions. For example, the stacking arrangement and the chip overhang 124, from the first riser 902, the second riser 904, and the third riser 906, provide a system that allows uniform sized chips and chips with different dimensions to be mounted on the carrier 102.

Further, it has been found that the chip overhang 124 allows for devices of different sizes to be arranged on the carrier 102. For example, the base device 110 can have a different value for the length 116 than the peripheral stacked device 112 and the inner stacked device 114. Further for example, the chip overhang 124 allows the peripheral stacked device 112 and the inner stacked device 114 to have different lengths or different overlaps with the base device 110. The variations between the lengths of the peripheral stacked device 112 and the inner stacked device 114 are limited by the mounting space on the carrier 102 and the space required to keep chips from contacting each other.

It has been found that the overlapping configuration of the integrated circuit device system 900 provides cooling and air flow in combination with the increased amount of chips mounted in the same mounting area. Further, it has been found that the heights, spaces, and distances between the base device 110, the peripheral stacked device 112, the inner stacked device 114, the first riser 902, the second riser 904, and the third riser 906 provide for air cooling and for buffering of space to prevent physical damage between components from temporary warpage and component shifting.

Further, it has been found that the mirrored chip assembly 930 further increases the capacity of devices that can be mounted on the carrier 102. The base device 110, the peripheral stacked device 112, the inner stacked device 114, the first riser 902, the second riser 904, and the third riser 906 can have an identical copy in the mirrored chip assembly 930 mounted to the second side 106.

It has been also found that the mirrored chip assembly 930 allows for an identical manufacturing process for the second side 106 as for the first side 104, which simplifies manufacturing steps and increases production yield.

Referring now to FIG. 10, therein is shown a peripheral end view of the first riser 902 of FIG. 9. The peripheral end view is taken from the peripheral end 108 of FIG. 9 of the carrier 102 of FIG. 9. The peripheral end view can include the body portion 905, the protrusion portion 907, and the peripheral stacked device 112.

The protrusion portion 907 extends beyond the body portion 905 from the peripheral end 108 and a side opposite to the peripheral end 108 (not shown). The top surface of the first riser 902 can include a width of 11.00 mm measured from the extraction end 202 of FIG. 2 of the carrier 102 to the insertion end 204 of FIG. 2 of the carrier 102. The height of the peripheral stacked device 112 from the top surface of the first side 104 to the top surface of the peripheral stacked device 112 can be 5.10 mm as an example.

Further, it has been found that the heights and distances of the integrated circuit device system 900, including the total vertical height of 5.10 mm for the peripheral stacked device 112, provides a low profile memory device but also provides mounting space for additional mounting capacity on the carrier 102.

Figure 11:
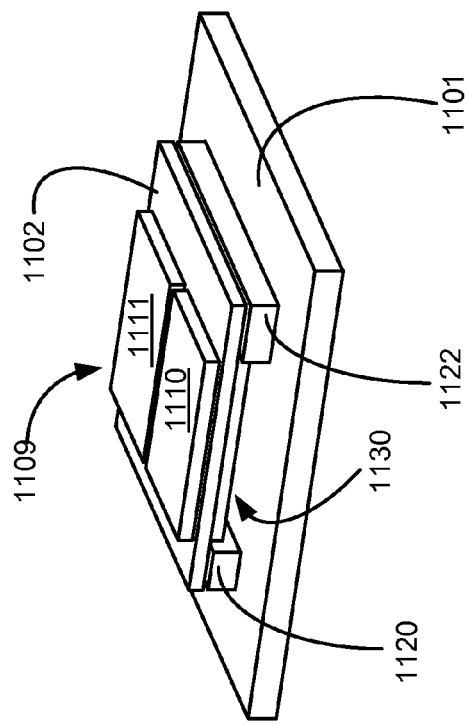
FIG. 11 is a side view and an isometric view of an integrated circuit device in a fourth embodiment of the present invention.
Figure 11:
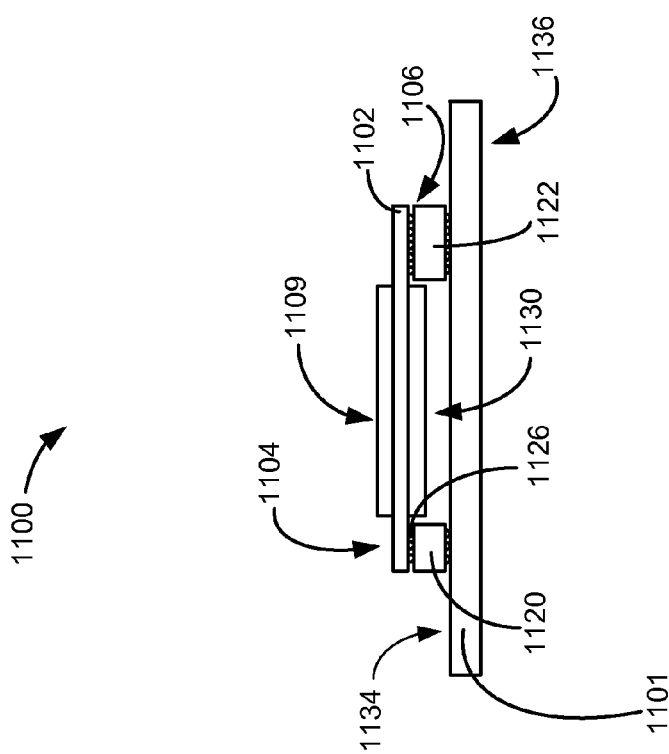

Referring now to FIG. 11, therein is shown a side view and an isometric view of an integrated circuit device 1100 in a fourth embodiment of the present invention. The example view of the fourth embodiment of the present invention shows a module in package configuration having top and bottom chips elevated about a support platform or PCB.

The integrated circuit packaging system 1100 can include a module interposer 1102. The module interposer 1102 can include a substrate, redistribution layer, or insulation structure with conductive pathways. The module interposer 1102 can include a module first side 1104 and a module second side 1106 opposite to the module first side 1104.

The integrated circuit packaging system 1100 can include an outer chip assembly 1109 attached to the module first side 1104. The outer chip assembly 1109 is one or more integrated circuit devices mounted to the module first side 1104. For example, the outer chip assembly 1109 can include a first top integrated circuit device 1110 and a second top integrated circuit device 1111 or additional integrated circuit devices.

The first top integrated circuit 1110 and the second top integrated circuit device 1111 can include a semiconductor device having one or more integrated transistors for implementing active circuitry. For example, the first top integrated circuit device 1110 can be similar to the peripheral stacked device 112 of FIG. 1.

The outer chip assembly 1109 can be considered the outer chips of the module because the outer chip assembly 1109 is positioned on the module interposer 1102 facing away from a support platform or PCB. Chips and devices mounted on the module second side 1106 can be considered inner because the chips are positioned in-between the module interposer 1102 and the PCB.

The example views show the first top integrated circuit 1110 and the second top integrated circuit device 1111 in a side-by-side or twin device configuration on top of the module interposer 1102. It is understood that the integrated circuit packaging system 1100 can include just the first top integrated circuit device 1110 or multiple chips (two or more) mounted on top of the module interposer 1102. The number of attached devices can depend on the design and space provided by the integrated circuit packaging system 1100.

The attachment configurations for the first top integrated circuit 1110 and the second top integrated circuit device 1111 to the module interposer 1102 can include a land grid array (LGA) configuration. However, the first top integrated circuit 1110 and the second top integrated circuit device 1111 can include a BGA configuration or wire-bonding configuration, as examples.

The integrated circuit packaging system 1100 can include a first riser 1120 and a second riser 1122. The first riser 1120 and the second riser 1122 are defined as structures for elevating chips and other interposer platforms. The first riser 1120 and the second riser 1122 can preferably be interposers or riser boards, which can redistribute an electrical connection.

The first riser 1120 and the second riser 1122 can be similar to the first riser 120 FIG. 1 and the second riser 122 of FIG. 1. The first riser 1120 and the second riser 1122 can be attached to the module second side 1106 of the module interposer 1102 at opposite ends.

The integrated circuit packaging system 1100 can include a mirrored chip assembly 1130 mounted to the module second side 1106. The mirrored chip assembly 1130 is mounted between the first riser 1120 and the second riser 1122 on the module second side 1106. The mirrored chip assembly 1130 can include an identical copy of the first top integrated circuit 1110 and the second top integrated circuit device 1111 but positioned on an opposite or mirrored side of the module interposer 1102. The mirrored chip assembly 1130 mirrors the positioning of the outer chip assembly 1109.

The integrated circuit packaging system 1100 can include a carrier 1101 for providing structural support for components and semiconductor devices mounted thereon. For example, the carrier 1101 can be a printed circuit board for mounting memory device such as dynamic random access memory (DRAM) module units.

The carrier 1101 is preferably a PCB but can also include a substrate of semi-conductive material as an example. The carrier 1101 can include a carrier first side 1134 and a carrier second side 1136 opposite to the carrier first side 1134. The carrier 1101 is similar to the carrier 102 of FIG. 1.

The integrated circuit packaging system 1100 can include a module interconnect 1126 for connecting components to other components, such as a carrier 1101. The module interconnect 1126 provides an electrical connection and can include a land, a pin, a pad, a solder ball, solder bump, or a solder pillar as examples. The module interconnect 1126 can attach the first riser 1120, the second riser 1122, and the module interposer 1102 to each other. The module interconnect 1126 can be similar to the device interconnect 126 of FIG. 1.

It has been discovered that the module interposer 1102, the first riser 1120, and the second riser 1122 creates mounting space for additional integrated circuits and chips mounted below the module interposer 1102. For example, the module interposer 1102 provides mounting space for four integrated circuit devices instead of only two mounted directly to carriers.

Further, it has been found that the outer chip assembly 1109, including the first top integrated circuit device 1110 and the second top integrated circuit device 1111, the module interposer 1102, the first riser 1120, the second riser 1122, and the mirrored chip assembly 1130 provide a module-in-package configuration for stacking solution flexibility and build-to-order applications. For example, the module-in-package design provides for memory components in a compact and narrow space that can be stacked in various configurations per the needs of the overall system.

It has been found that the elevation and multiple mounting levels provided by the first riser 1120 and the second riser 1122 allows the mirrored chip assembly 1130 to be mounted beneath the first top integrated circuit 1110 and the second top integrated circuit device 1111.

It has been found that the first riser 1120 and the second riser 1122 allows the mirrored chip assembly 1130 to be suspended above the carrier 1101, which provides for additional space for air cooling and for buffering space to prevent physical damage between components from temporary warpage and component shifting.

Further, it has been discovered that the first riser 1120 and the second riser 1122, in a module-in-package configuration, provides for additional mounting space for additional components to be mounted directly beneath the mirrored chip assembly 1130. The mirrored chip assembly 1130 can be suspended above these components to provide for air-cooling and protection from physical contact.

Figure 12:
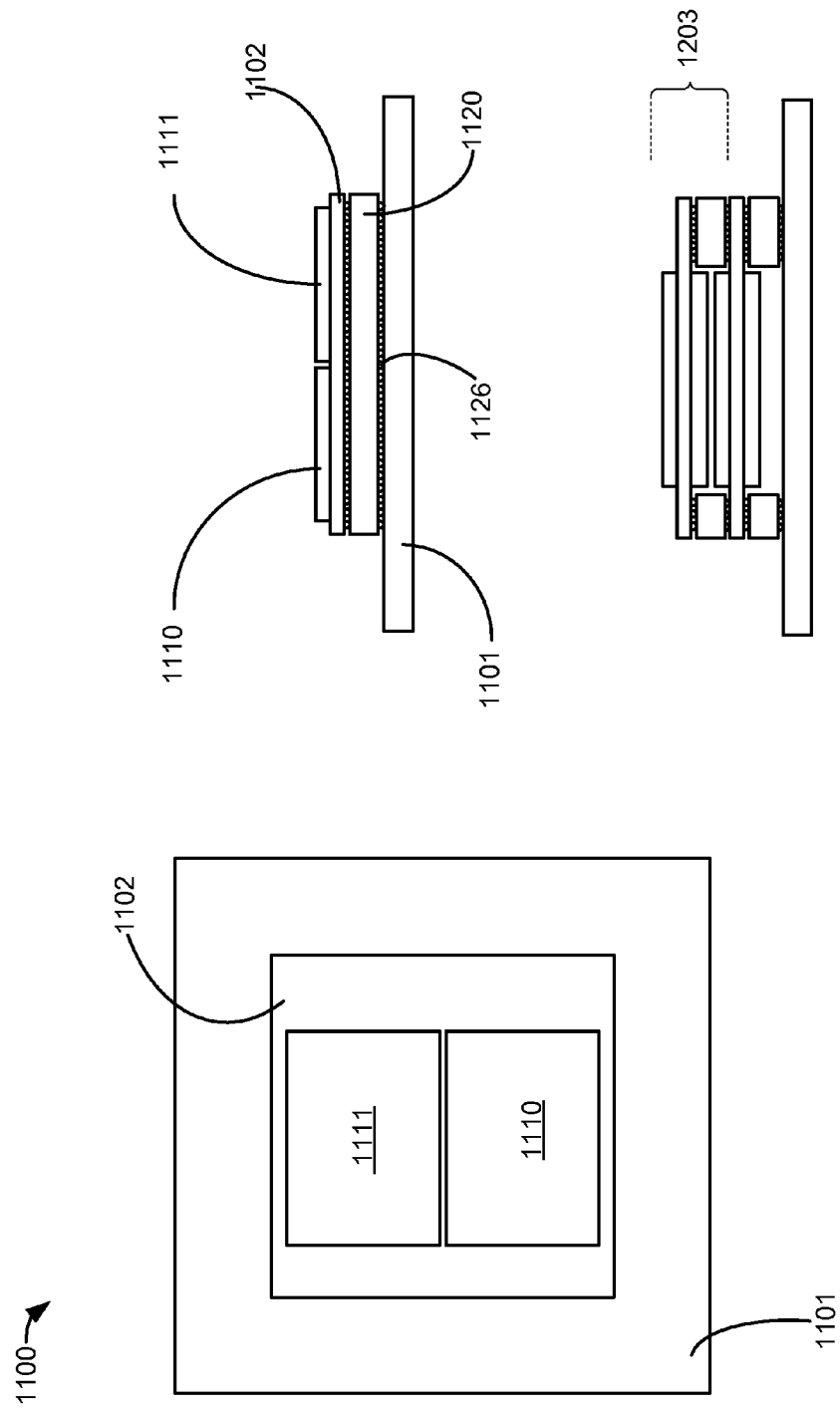
FIG. 12 is three additional example views of the structures of FIG. 11

Referring now to FIG. 12, therein is shown three additional example views of the structures of FIG. 11. The example view can include a partial top view, a peripheral end view, and a cross-sectional view of the integrated circuit device 1100 of FIG. 11. For example, the peripheral end view of the integrated circuit packaging system 1100 is similar to the view taken from the peripheral end 108 of FIG. 1.

The example views can include the carrier 1101, the module interposer 1102, the first top integrated circuit 1110 and the second top integrated circuit device 1111 of the outer chip assembly 1109 of FIG. 11, the first riser 1120, and the module interconnect 1126.

The peripheral end view shows a lateral sidewall of the first riser 1120. The first riser 1120 can be attached between the module interposer 1102 and the carrier 1101. In this view, the first riser 1120 is blocking the view of the mirrored chip assembly 1130 of FIG. 11.

A stacked module 1203 can be mounted on the module interposer 1102. The stacked module 1203 can include identical components of the components shown in FIG. 11. For example, the stacked module 1203 can include an identical copy of the module interposer 1102, the first top integrated circuit 1110, the second top integrated circuit device 1111, the first riser 1120, the mirrored chip assembly 1130, and the module interconnect 1126.

Figure 13:
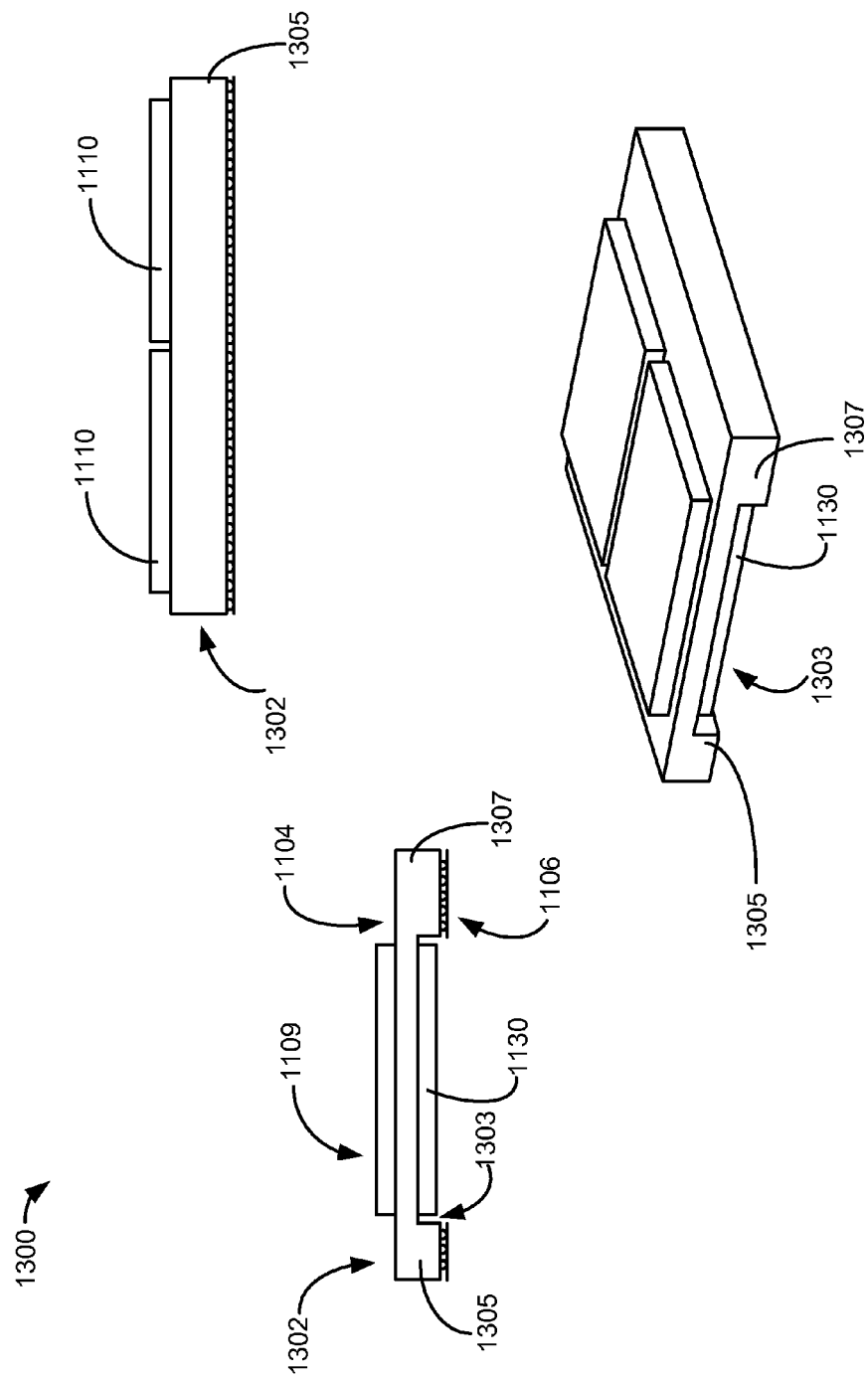
FIG. 13 is three example views of an integrated circuit packaging system in a fifth embodiment of the present invention.

Referring now to FIG. 13, therein is shown three example views of an integrated circuit packaging system 1300 in a fifth embodiment of the present invention. The example views can include a side view, an isometric view, and a peripheral end view. The integrated circuit packaging system 1300 can include identical components of the integrated circuit packaging system 1100 of FIG. 11 such as the first top integrated circuit device 1110 and the second top integrated circuit device 1111 of the outer chip assembly 1109, and the mirrored chip assembly 1130.

The integrated circuit packaging system 1300 is similar to the integrated circuit packaging system 1100 except that the integrated circuit packaging system 1300 includes a modification to the module interposer 1102 of FIG. 11. The integrated circuit packaging system 1300 can include a module interposer 1302 having a cavity 1303, a first leg 1305, and a second leg 1307.

The cavity 1303 can be formed in the module second side 1106 of the module interposer 1302. For example, the module interposer 1302 can be a cap or a cover with a hollowed out middle section. The cavity 1303 can form the first leg 1305 and the second leg 1307, which are support structures that support the platform section of the interposer.

The first leg 1305 and the second leg 1307 can be on opposite ends of the module interposer 1302. The first leg 1305 and the second leg 1307 can be mounted to the carrier 1101 of FIG. 1. The first leg 1305 and the second leg 1307 can replace the structural function of the first riser 1120 of FIG. 1 and the second riser 1122 of FIG. 1.

It has been discovered that the module interposer 1302, having the cavity 1303, on the module second side 1106 creates mounting space for additional chip assemblies. The module interposer 1302 having the cavity 1303 provides mounting space for four integrated circuit devices instead of only two mounted on the top of the interposer.

It has been found that the module interposer 1302 having the cavity 1303, the first leg 1305, and the second leg 1307, replaces the need for spacers or other riser components and thus saves materials and manufacturing steps. The first leg 1305 and the second leg 1307 allow the mirrored chip assembly 1130 to be mounted beneath the first top integrated circuit 1110 and the second top integrated circuit device 1111. The first leg 1305 and the second leg 1307 also allow the mirrored chip assembly 1130 to be suspended above the carrier 1101, which provides additional airflow and cooling.

Further, it has been found that the first top integrated circuit device 1110, the second top integrated circuit device 1111, the module interposer 1302, the first leg 1305, the second leg 1307, and the mirrored chip assembly 1130 provide a module-in-package configuration for stacking solution flexibility and build-to-order applications. For example, the module-in-package design provides for memory components in a compact and narrow space that can be stacked in various configurations per the needs of the overall system.

It has been found that the elevation and multiple mounting levels provided by the first leg 1305 and the second leg 1307 allows the mirrored chip assembly 1130 to be mounted beneath the first top integrated circuit 1110 and the second top integrated circuit device 1111.

It has been found that the first leg 1305 and the second leg 1307 allows the mirrored chip assembly 1130 to be suspended above the carrier 1101, which provides for additional space for air cooling and for buffering space to prevent physical damage between components from temporary warpage and component shifting.

Further, it has been discovered that the first leg 1305 and the second leg 1307, in a module-in-package configuration, provides for additional mounting space for additional components to be mounted directly beneath the mirrored chip assembly 1130. The mirrored chip assembly 1130 can be suspended above these components to provide for air-cooling and protection from physical contact.

Figure 14:
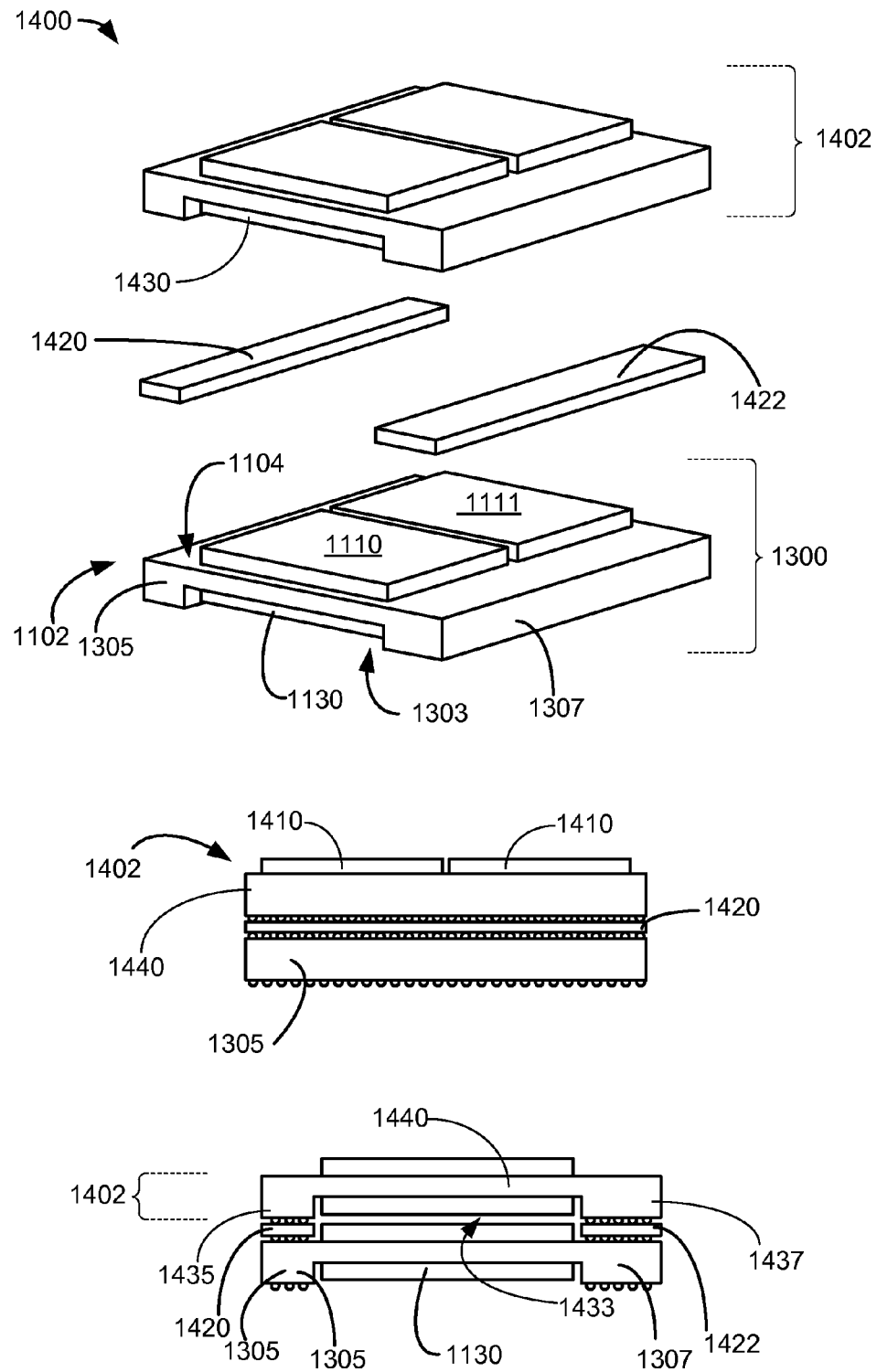
FIG. 14 is example views of an integrated circuit packaging system in a sixth embodiment of the present invention.

Referring now to FIG. 14, therein is shown example views of an integrated circuit packaging system 1400 in a sixth embodiment of the present invention. The example views can include an isometric view, a peripheral end view, and a cross sectional view. The example views can include the components of the integrated circuit packaging system 1300 but a stacked module 1402 can be mounted over the module interposer 1302 of the base device.

The integrated circuit packaging system 1400 can include the stacked module 1402. The stacked module 1402 can include identical components of the module package in FIG. 13 except that the stacked module 1402 is stacked on top of the module interposer 1302 of the base device. In a stacked configuration, the integrated circuit packaging system 1300 can provide the base for mounting the stacked module 1402.

The integrated circuit packaging system 1400 can include a first riser 1420 and a second riser 1422, which are structurally identical to the first riser 1120 of FIG. 11 and the second riser 1122 of FIG. 11. The first riser 1420 and the second riser 1422 can be mounted between the integrated circuit packaging system 1300 and the stacked module 1402.

The first riser 1420 and the second riser 1422 mounted on the module first side 1104 allows for mounting of multiple module stacks on a single carrier. The stacked module 1402 can be mounted on the first riser 1420 and the second riser 1422. The stacked module 1402 can be similar to the integrated circuit packaging system 1300 and include identical components.

For example, the stacked module 1402 can include a stacked module interposer 1440 having a stacked cavity 1433, a stacked first leg 1435, and a stacked second leg 1437. The stacked module interposer 1440 can also include a first stacked device 1410, a second stacked device 1411, a stacked mirrored assembly 1430.

The stacked mirrored assembly 1430 can be suspended above the first top integrated circuit device 1110 and the second top integrated circuit device 1111 of FIG. 13. The stacked first leg 1435 and the stacked second leg 1437 can support the suspended components of the stacked mirrored assembly 1430. The first riser 1420 and the second riser 1422 are attached to the stacked first leg 1435 and the stacked second leg 1437.

Figure 15:
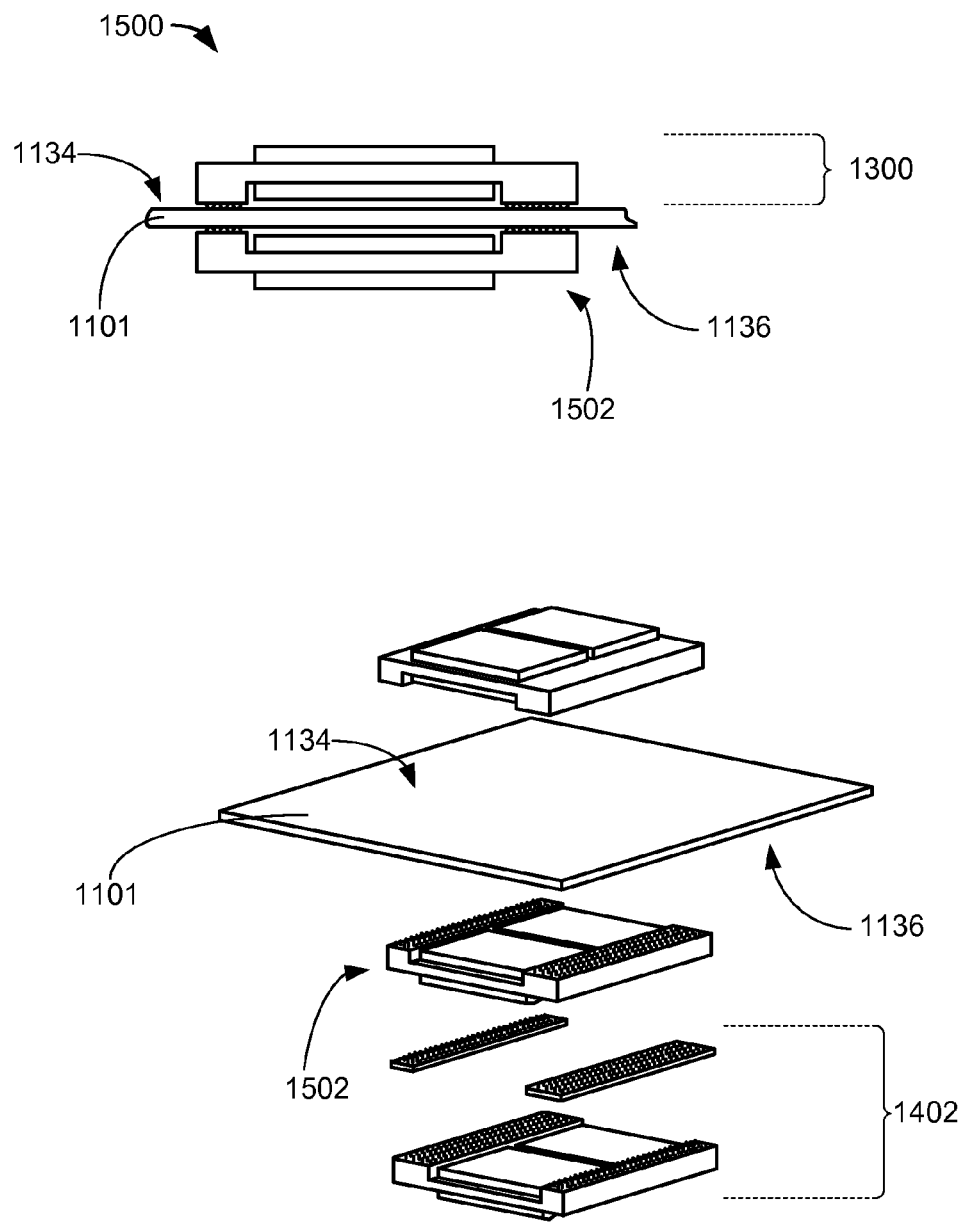
FIG. 15 is two example views of an integrated circuit packaging system in a seventh embodiment of the present invention.

Referring now to FIG. 15, therein is shown two example views of an integrated circuit packaging system 1500 in a seventh embodiment of the present invention. The example views can include identical components of the integrated circuit packaging system 1300. Further, the integrated circuit packaging system 1500 can also include a bottom module 1502 attached to the carrier second side 1136.

The bottom module 1502 is an identical and mirrored copy of the module mounted on the carrier first side 1134. The bottom module 1502 can include all the components of the integrated circuit packaging system 1300. For example, the bottom module 1502 mirrors the integrated circuit packaging system 1300 mounted on the carrier first side 1134.

The integrated circuit packaging system 1500 can also include the stacked module 1402. The stacked module 1402 can be mounted on the integrated circuit packaging system 1300 at the carrier first side 1134 and can be mounted to the bottom module 1502 at the carrier second side 1136. The mirrored configuration of the integrated circuit packaging system 1500 allows identical components to be mounted on both the carrier first side 1134 and the carrier second side 1136.

For illustrative purposes, the integrated circuit packaging system 1500 uses the configuration of the integrated circuit packaging system 1300 as the device mounted on the carrier 1101. However, it is understood that the configuration used can be the configuration of the integrated circuit packaging system 1100 of FIG. 11.

Figure 16:
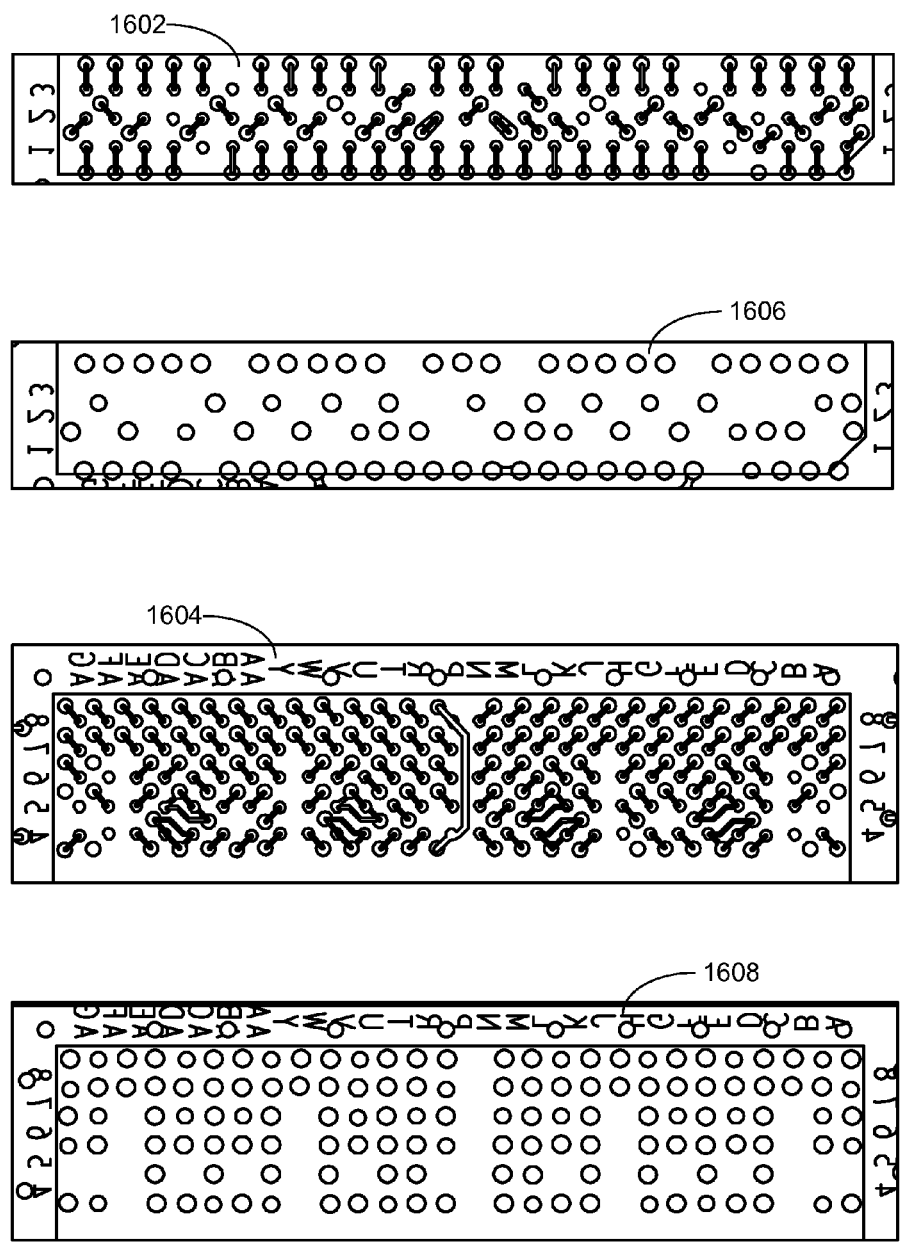
FIG. 16 is detailed example views of the carrier of FIG. 1.

Referring now to FIG. 16, therein is shown detailed example views of the module interposer 1102 of FIG. 1. The detailed views show an example configuration for the mirrored breakouts between the module first side 1104 of FIG. 1 and the module second side 1106 of FIG. 1.

The example shows a pin-out configuration although it is understood that the module interposer 1102 can include other mounting configurations. For example, the module interposer 1102 can include a BGA configuration. The detailed views show a first front plane 1602, a second front plane 1604, a first internal plane 1606, and a second internal plane 1608.

The first front plane 1602 and the first internal plane 1606 show the routing configuration of the module first side 1104. The routing configuration can also be identical on the module second side 1106. The mirrored configuration or option allows a direct connection between the upper modules and the lower modules without additional routing through the interposer. For example, a direct connection is provided between the integrated circuit packaging system 1300 of FIG. 13 and the bottom module 1502 of FIG. 15.

It has been found that the mirrored configuration of the carrier 1101 produces better signal performance through the direct connection between the top modules and the bottom module 1502. It has also been found that the direct connection reduces the number of routing layers required and lowers the cost of materials needed for the creation of a PCB.

The second front plane 1604 and the second internal plane 1608 can be identical to the first front plane 1602 and the first internal plane 1606, except that the second front plane 1604 and the second internal plane 1608 can show a sixty-four bit data configuration.

Figure 17:
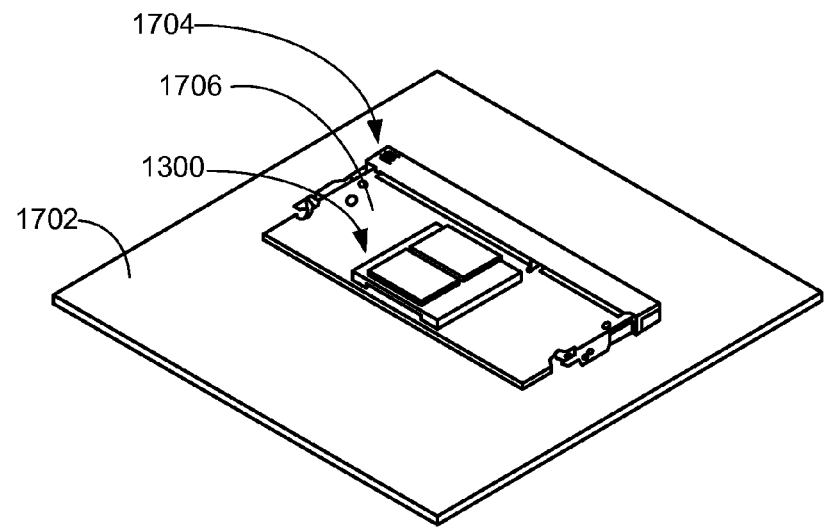
FIG. 17 is three example views of the integrated circuit packaging system mounted on a motherboard.
Figure 17:
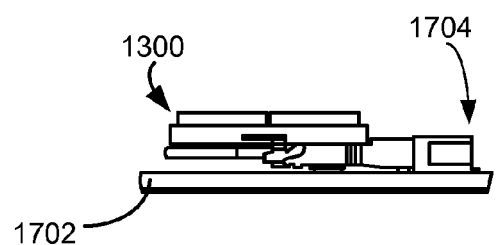
Figure 17:
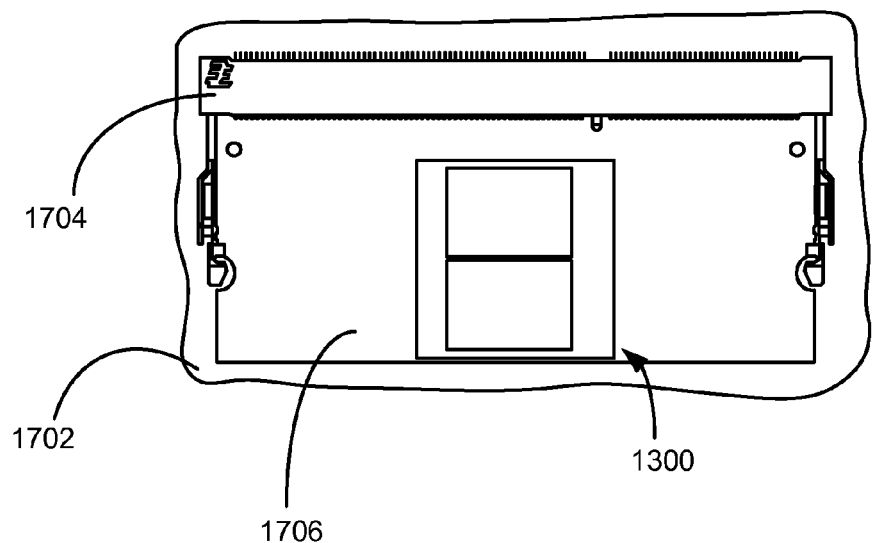

Referring now to FIG. 17, therein is shown three example views of the integrated circuit packaging system 1300 mounted on a motherboard 1702. The example views can include an isometric view, a peripheral end view, and a top view.

The example views can include an example of the integrated circuit packaging system 1300 using a small outline dual in-line memory module configuration (SODIMM). The example can include a socket 1704, and a module board 1706. The module board 1706 can be a memory substrate and can be similar to the carrier 1101 of FIG. 1.

The socket 1704 can include a double date rate type three (DDR3) SODIMM socket attached to the motherboard 1702. The integrated circuit packaging system 1300 can be attached to the module board 1706, which can include a SODIMM PCB. The integrated circuit packaging system 1300 can occupy one-fifth of the area of the module board 1706, allowing additional components to be attached to the module board 1706.

It has been found that the configuration of the integrated circuit packaging system 1300 occupies one fifth of the area of a standard SODIMM. For example, the module interposer 1102 of FIG. 11 allows four chips to be mounted in the same space that two chips would be mounted directly on the module board 1706. The module interposer 1101 provides mounting space for the mirrored chip assembly 1130 of FIG. 1 and additional space so that the mirrored chip assembly 1130 can be suspended above the module board 1706.

It has been discovered that the mirrored configuration of the mirrored chip assembly 1130 allows a direct connection between the top and bottom devices. For example, the mirrored chip assembly 1130 is in a mirrored position to the first top integrated circuit device 1110 of FIG. 11 and the second top integrated circuit device 1111 of FIG. 11.

It has also been found that the integrated circuit packaging system 1300 and the other embodiments of the present invention can support multiple configuration options with the same ball-out and pin-out. The compact module configuration of the present invention also supports pin-out having ideal return path and minimum noise at all transition points. It has been found that the module interposer 1102 of FIG. 11, the first riser 1120 of FIG. 11, and the second riser 1122 of FIG. 11 provide conductive pathways that reduce flight time yields for higher performance.

Further, it has been found that the compact configuration of the first top integrated circuit device 1110 and the second top integrated circuit device 1111, the module interposer 1102, and the mirrored chip assembly 1130 improves signal strength and allows for compatibility with various memory configurations. For example, the module-in-package configuration is compatible with a target frequency of DDR3-2133 1067 MHz clock and can support a module density of two gigabytes (GB), four GB, or greater.

Figure 18:
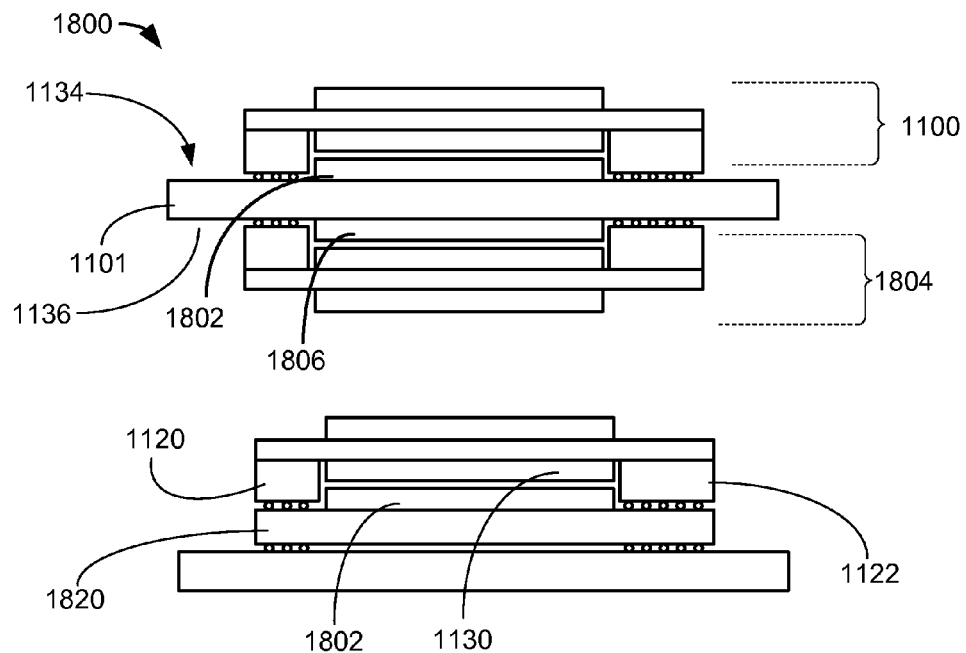
FIG. 18 is two example views of an integrated circuit packaging system in an eighth embodiment of the present invention.

Referring now to FIG. 18, therein is shown two example views of an integrated circuit packaging system 1800 in an eighth embodiment of the present invention. The examples shown in FIG. 18 are two example configurations of the integrated circuit packaging system 1100 with additional components. The integrated circuit packaging system 1800 is similar to the integrated circuit packaging system 1100 of FIG. 11, except that the integrated circuit packaging system 1800 can also include a correction chip 1802.

The correction chip 1802 is an error-correcting code device or error checking and correction device. In each example, the correction chip 1802 can be mounted directly beneath the mirrored chip assembly 1130 with the mirrored chip assembly 1130 suspended above the correction chip

1802. The correction chip 1802 can detect and correct data corruption for the other memory components of the system.

In a first example, the correction chip 1802 can be attached to the carrier first side 1134 of the carrier 1101. The correction chip 1802 can be between the first riser 1120 and the second riser 1122. The first riser 1120 and the second riser 1122 provide clearance space for the mirrored chip assembly 1130 to be suspended above the correction chip 1802.

The first example also includes a bottom module 1804 attached to the carrier second side 1136. The bottom module 1804 can be identical to the integrated circuit packaging system 1100 mounted to the carrier first side 1134. The integrated circuit packaging system 1800 can include a bottom correction chip 1806. The bottom correction chip 1806 can be identical to the correction chip 1802 except the bottom correction chip 1806 mirrors the correction chip 1802 on the other side of the carrier 1101.

In a second example, the correction chip 1802 can be attached to an interposer device 1820. The interposer device 1820 can include an interposer, memory device, redistribution layers, vias, or combination thereof. For example, the interposer device 1820 can include a memory device that can also re-route other devices mounted thereon. The interposer device 1820 can be attached to the carrier first side 1134.

The interposer device 1820 can provide an electrical connection between the carrier 1101, the first riser 1120, the second riser 1122, and the correction chip 1802. The interposer device 1820 can be attached to the carrier first side 1134. The interposer device 1820 can elevate the first riser 1120 and the second riser 1122 above the carrier 1101.

It has been found that the first and second examples show configurations of the correction chip 1802 that can be added to the carrier 1101 and still utilize the same address termination as the modules in the package.

The configuration of the integrated circuit packaging system 1800 can include a pin-out configuration for the module interposer 1102 of FIG. 1 but the system can also include other examples. For example, the configuration of the module interposer 1102 can include a ball-out configuration of a BGA.

The two examples shown in FIG. 18 show configurations of the integrated circuit packaging system 1100 with the correction chip 1802. It is understood that the correction chip 1802 can also be included with the integrated circuit packaging system 1300 of FIG. 13. The integrated circuit packaging system 1800 can include the same inventive benefits as the integrated circuit packaging system 1100, the integrated circuit packaging system 1300, the integrated circuit packaging system 1400 of FIG. 14, and the integrated circuit packaging system 1500 of FIG. 15.

It has been discovered that the first riser 1120 and the second riser 1122, in a module-in-package configuration, provides for additional mounting space the correction chip 1802 to be mounted directly beneath the mirrored chip assembly 1130. The mirrored chip assembly 1130 can be suspended above the correction chip to provide for air-cooling and protection from physical contact.

Figure 19:
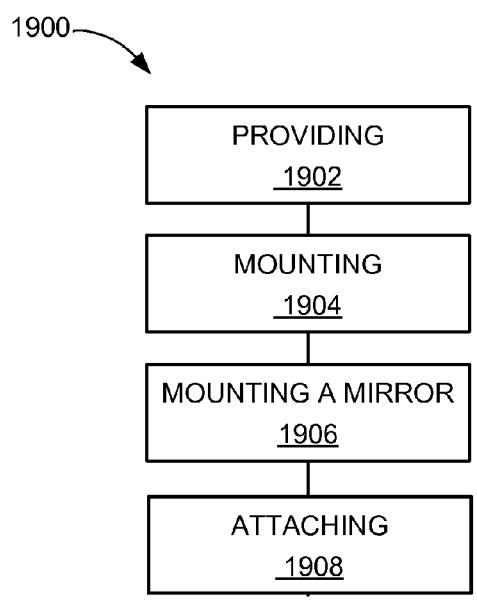
FIG. 19 is a flow chart of a method of manufacture of the integrated circuit device system in a further embodiment of the present invention.

Referring now to FIG. 19, therein is shown a flow chart of a method 1900 of manufacture of the integrated circuit device system in a further embodiment of the present invention. The method 1900 includes providing a module interposer having a module first side and a module second side in a block 1902; mounting an outer chip assembly to the module first side in a block 1904; mounting a mirror chip assembly to the module second side, the mirror chip assembly below the outer chip assembly in a block 1906; and attaching a carrier on the module second side, the carrier includes a carrier first side and a carrier second side, the mirror chip assembly suspended above the carrier first side in a block 1908.

Thus, it has been discovered that the integrated circuit device system of the present invention furnishes important and heretofore unknown and unavailable solutions, capabilities, and functional aspects for increasing the performance and capacity of electronic and memory devices. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit device systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit device system comprising:
   providing a module interposer having a module first side and a module second side;
   mounting an outer chip assembly to the module first side;
   mounting a mirrored chip assembly to the module second side, the mirrored chip assembly below the outer chip assembly;
   providing electrical connections for the module interposer by attaching risers to the module second side immediately adjacent to opposing edges of the mirrored chip assembly; and
   coupling a carrier on the module second side by the risers, the carrier including a carrier first side and a carrier second side, the mirrored chip assembly suspended above the carrier first side.

2. The method as claimed in claim 1 wherein:
   providing the module interposer includes providing the module interposer having a cavity at the module second side; and
   mounting the mirrored chip assembly includes mounting the mirrored chip assembly into the cavity.

3. The method as claimed in claim 1 wherein attaching risers includes:
   attaching a first riser and a second riser to the module second side; and
   wherein:
   attaching the carrier includes the first riser and the second riser directly attached to the carrier, the first riser and the second riser between the carrier and the module interposer.

4. The method as claimed in claim 1 further comprising mounting a bottom module to the carrier second side of the carrier.

5. The method as claimed in claim 1 wherein:
providing the module interposer includes providing the module interposer having a first leg and a second leg on the module second side; and
attaching the carrier includes attaching the first leg and the second leg to the carrier first side of the carrier.

6. A method of manufacture of an integrated circuit device system comprising:
providing a module interposer having a module first side and a module second side;
mounting an outer chip assembly to the module first side, the outer chip assembly includes a first top integrated circuit device and a second top integrated circuit device;
mounting a mirrored chip assembly to the module second side;
attaching a module interconnect to the module second side;
providing electrical connections for the module interposer by attaching risers to the module second side immediately adjacent to opposing edges of the mirrored chip assembly; and
coupling a carrier to the module interconnect by the risers, the carrier including a carrier first side and a carrier second side, the mirrored chip assembly suspended above the carrier first side.

7. The method as claimed in claim 6 further comprising:
attaching a first riser and a second riser to the module second side; and
wherein:
attaching the carrier includes the first riser and the second riser directly attached to the carrier, the first riser and the second riser bordering the mirrored chip assembly.

8. The method as claimed in claim 6 wherein attaching risers includes:
attaching a first riser and a second riser to the module second side; and
wherein:
attaching the carrier includes the first riser and the second riser directly on the carrier, the first riser and the second riser between the carrier and the module interposer; and
the method further comprises mounting a stacked module on the module first side.

9. The method as claimed in claim 6 wherein:
providing the module interposer includes providing the module interposer having a first leg and a second leg on the module second side;
mounting a first riser and a second riser on the module first side; and
mounting a stacked module directly on the first riser and the second riser.

10. The method as claimed in claim 6 further comprising mounting a bottom module to the carrier second side of the carrier.

11. An integrated circuit device system comprising:
a module interposer having a module first side and a module second side;
a outer chip assembly mounted to the module first side;
a mirrored chip assembly mounted to the module second side, the mirrored chip assembly below the outer chip assembly;
risers attached to the module second side immediately adjacent to opposing edges of the mirrored chip assembly, the risers providing electrical connections for the module interposer; and
a carrier coupled to the module second side by the risers, the carrier including a carrier first side and a carrier second side, the mirrored chip assembly suspended above the carrier first side.

12. The system as claimed in claim 11 wherein:
the module interposer includes a cavity at the module second side; and
the mirrored chip assembly is mounted in the cavity.

13. The system as claimed in claim 11 wherein the risers attached to the module second side include:
a first riser directly attached to the module second side and directly attached to the carrier, the first riser between the carrier and the module interposer; and
a second riser directly attached to the module second side and directly attached to the carrier, the second riser between the carrier and the module interposer.

14. The system as claimed in claim 11 further comprising a bottom module attached to the carrier second side.

15. The system as claimed in claim 11 wherein the module interposer includes a first leg on the module second side and a second leg on the module second side, the first leg and the second leg attached to the carrier first side of the carrier.

16. The system as claimed in claim 11 further comprising a module interconnect between the module interposer and the carrier.

17. The system as claimed in claim 16 further comprising:
a first riser attached to the module second side; and
a second riser attached to the module second side, the second riser and the first riser bordering the mirrored chip assembly.

18. The system as claimed in claim 16 wherein the risers attached to the module second side include:
a first riser between the module second side and the carrier;
a second riser between the module second side and the carrier; and
the system further includes a stacked module mounted to the module first side.

19. The system as claimed in claim 16 wherein:
the module interposer includes a first leg on the module second side and a second leg on the module second side; and
further comprising:
a first riser on the module first side;
a second riser on the module first side; and
a stacked module directly on the first riser and the second riser.

20. The system as claimed in claim 16 further comprising:
a bottom module mounted to the carrier second side of the carrier; and
a stacked module mounted to the bottom module.

* * * * *